(12) United States Patent
Kodavalla et al.

(10) Patent No.: US 7,949,907 B2
(45) Date of Patent: May 24, 2011

(54) METHOD AND DEVICE FOR DATA COMMUNICATION

(75) Inventors: Vijay Kumar Kodavalla, Bangalore (IN); Chiranjeev Acharya, Balangir (IN)

(73) Assignee: Wipro Limited, Bangalore, Karnataka (IN)

( * ) Notice: Subject to any disclaimer, the term of this patent is extended or adjusted under 35 U.S.C. 154(b) by 528 days.

(21) Appl. No.: 11/538,072

(22) Filed: Oct. 3, 2006

(65) Prior Publication Data
US 2008/0092001 A1 Apr. 17, 2008

(51) Int. Cl.
*G06K 5/04* (2006.01)
(52) U.S. Cl. ........................................ 714/700
(58) Field of Classification Search .................. 714/700, 714/724, E11.009; 326/38, 39, 41, 93
See application file for complete search history.

(56) References Cited

U.S. PATENT DOCUMENTS

| | | | | |
|---|---|---|---|---|
| 5,633,813 A | * | 5/1997 | Srinivasan | 703/14 |
| 5,673,198 A | * | 9/1997 | Lawman et al. | 716/11 |
| 6,080,204 A | * | 6/2000 | Mendel | 716/7 |
| 6,323,679 B1 | * | 11/2001 | Robertson et al. | 326/39 |
| 6,964,029 B2 | * | 11/2005 | Poznanovic et al. | 716/7 |
| 6,983,456 B2 | * | 1/2006 | Poznanovic et al. | 717/133 |
| 7,127,645 B2 | * | 10/2006 | Toyoda et al. | 714/700 |
| 7,281,233 B1 | * | 10/2007 | Sivasubramaniam | 716/15 |
| 7,353,162 B2 | * | 4/2008 | Huang et al. | 703/23 |
| 7,490,312 B1 | * | 2/2009 | Ochotta et al. | 716/16 |
| 7,685,454 B2 | * | 3/2010 | Cornelius et al. | 713/400 |
| 2004/0243384 A1 | * | 12/2004 | Chen et al. | 703/23 |
| 2007/0016835 A1 | * | 1/2007 | Hronik et al. | 714/727 |
| 2007/0099314 A1 | * | 5/2007 | Chen et al. | 438/14 |

* cited by examiner

*Primary Examiner* — Jeffrey A Gaffin
*Assistant Examiner* — Daniel F McMahon
(74) *Attorney, Agent, or Firm* — Prakash Nama; Global IP Services, PLLC

(57) ABSTRACT

A programmable logic device is presented. The device comprises a plurality of logic elements and a plurality of I/O pins; a multiplexer and/or a de-multiplexer unit. The multiplexer and/or multiplexer unit is coupled between said logic elements and I/O pins. The device further comprises a control unit for generating control signal/s for selecting one of the inputs of the multiplexer and/or one of the outputs of the de-multiplexer. The control unit includes inputs for receiving a first clock signal, a second clock signal and indicators, said indicators being indicative of a phase skew relation amongst the clock signals. The control unit being configured for generating adaptively adjusted control signal/s according to the clock signals and indicators, said control signal/s are adaptively adjusted for eliminating impact of the phase skew amongst the clock signals.

32 Claims, 17 Drawing Sheets

METHOD AND DEVICE FOR DATA COMMUNICATION

FIELD OF INVENTION

The invention relates to data communication, more particularly the invention relates to a data communication amongst programmable logic devices.

BACKGROUND

In the nanometer era, Application Specific Integrated Circuit (ASIC)/System on Chip (SoC) complexities in-terms of gate count and operating frequencies are tremendously increasing. For performing prototype/emulation of complex ASIC/SoC, multiple programmable devices (usually Field Programmable Gate Arrays (FPGAs)) are used. This requires partitioning of the ASIC/SoC design. Partitioning of ASIC/SoC design over multiple programmable logic devices (Multi-FPGA) decreases operating frequency compared to a single FPGA, primarily due to resulting combinatorial paths between FPGAs, which most often become the critical paths. Post partitioning reduction in operating frequency due to combinatorial paths between FPGAs is observed due to additional delays introduced between input/output (I/O or IO) pins, FPGA route delays, interconnect board trace delays etc. Also multi-FPGA partitioning usually results in large I/O pin requirement than available physical pins in FPGA and demands time division multiplexing (TDM) of the pins.

High speed ASIC/SoC designs demand higher prototype/emulation system operating frequency and any inefficiency at the I/O pins is not desirable.

In ASIC/SoC designs, for increasing the operating frequency skewed internal clock techniques are commonly used. These techniques are often referred as useful-skew or cycle-stealing techniques. However these techniques are not suitable while emulating logic in programmable logic devices (e.g. FPGAs). This is because of limitations associated with the programmable logic devices. For example, cycle-stealing techniques require a plurality of clock lines, whereas programmable logic device (hereinafter term FPGA or FPGAs is used interchangeably with term programmable device) contain limited number of low skew global clock lines that distribute clock signals to every register in the chip. This limits usability of clock skew technique in FPGAs, as this demands more global clock lines for routing various phase shifted clock signals. The programmable logic devices are pre-layout devices and it may be difficult to introduce a plurality clock lines. In all, programmable logic devices do not provide sufficient clock line resources.

Further implementing cycle-stealing techniques requires a best case timing information along with that of worst case which is difficult in FPGAs. Most of the FPGA vendors will not provide this best case timing information. And even if this best case timing information is provided, they are usually only conservative estimates. The benefits achievable with this cycle-stealing technique also depends on gap between worst and best case delays. The benefits of this cycle-stealing technique will diminish as gap between worst and best case delay is high. Usually the best case delays in FPGA are very low, as low as 25% of that of worst case delays, which makes the emulated logic prone to malfunction because of false signals/glitches. That is, if clock skew technique is applied to FPGAs, hold violations could occur with best case delays and system will be non-functional apart from diminishing or no benefits due to huge worst-best case delay gap. Therefore, it is not preferable to use cycle-stealing technique or skewed clock signaling for improving operating frequency in programmable devices.

SUMMARY OF THE INVENTION

To this end, the present technique provides a programmable logic device comprising: a plurality of logic elements and a plurality of I/O pins; a multiplexer unit and/or a de-multiplexer unit coupled between said logic elements and I/O pins, and; a control unit for generating control signal/s for selecting one of the inputs of the multiplexer and/or one of the outputs of the de-multiplexer, said control unit includes inputs for receiving a first clock signal, a second clock signal and indicators, said indicators being indicative of a phase skew relation amongst the clock signals and the control unit being configured for generating adaptively adjusted control signal/s according to the clock signals and indicators, said control signal/s are adaptively adjusted for eliminating impact of the phase skew amongst the clock signals. The device further comprising: a logic element coupled directly to the plurality of I/O pins through one or more delay elements. The control unit comprises: a series of registers, wherein each register of said series of registers providing an output; and a logic unit receiving said indicators for selectively providing one of the outputs of the registers as the control signal. The first register of said series of registers is provided with the first clock signal and remaining registers are provided with the second clock signal. The output of the second register of said series of registers is coupled to clear or reset input of the first register. The control unit includes a plurality of logic gates for selectively providing one of the outputs of the registers as the control signal. The device further comprises a clock signal generation circuit. The first and second clock signals are time varying signals wherein the second clock signal varies at a speed that is at least P times higher than the speed of the first clock signal, P being a number of input/output signals that are being multiplexed/de-multiplexed by the multiplexer/de-multiplexer unit. The first clock signal is a CoreClock signal supplied for clocking said programmable device. The second clock signal is a MuxClock signal supplied for clocking said multiplexer/de-multiplexer unit and associated control units. The control signal/s are adaptively adjusted according to said indicators for eliminating false signaling or glitches and hold violations due to best case delays, caused due to skewed clock signals.

According to another aspect a control unit is provided, said control unit comprising: a plurality of inputs for receiving a first clock signal, a second clock signal and indicators, wherein said indicators being indicative of a phase skew relation amongst the clock signals and the control unit being configured for generating adaptively adjusted control signal/s according to the clock signals and indicators, said control signal/s are adaptively adjusted for eliminating impact of the phase skew amongst the clock signals. The control unit comprises a series of registers; each register of the series of registers provides an output, and a logic unit receiving said indicators for selectively providing one of the outputs of the registers as the control signal. The first register of said series of registers is provided with the first clock signal and remaining registers are provided with the second clock signal. The output of the second register of said series of registers is coupled to clear or reset input of the first register. The control unit includes a plurality of logic gates for selectively providing one of the outputs of the registers as the control signal. The first and second clock signals are time varying signals wherein the second clock signal varies at a speed that is at least P times higher than the speed of the first clock signal, P being a number of input/output signals that are being multiplexed/de-multiplexed by the multiplexer/de-multiplexer unit. The control signal/s are adaptively adjusted according to said indicators for eliminating false signaling or glitches and hold violations due to best case delays, caused due to skewed clock signals.

According to yet another aspect a coupling device is provided, said coupling device being capable of selectively coupling a first line to a second line, of which at least the first or the second line is one amongst a plurality of lines, said coupling device comprising: a control unit for enabling selection of the line/s, wherein said control unit includes a plurality of inputs for receiving a first clock signal, a second clock signal and indicators, wherein said indicators being indicative of a phase skew relation amongst the clock signals and the control unit being configured for generating adaptively adjusted control signal/s according to the clock signals and indicators, said control signal/s are adaptively adjusted for eliminating impact of the phase skew amongst the clock signals. The control unit includes a series of registers, each register of the series of registers provides an output, and wherein the coupling device includes a logic unit for receiving said indicators to selectively provide one of the outputs of the series of registers as the control signal. The first register of said series of registers is provided with the first clock signal and remaining registers are provided with the second clock signal. The output of the second register of said series of registers is coupled to a clear or reset input of the first register. The control unit includes a plurality of logic gates for selectively providing one of the outputs of the registers as the control signal. The first and second clock signals are time varying signals wherein the second clock signal varies at a speed that is at least P times higher than the speed of the first clock signal, P being a number of input/output signals that are being multiplexed/de-multiplexed by the multiplexer/de-multiplexer unit. The control signal/s are adaptively adjusted according to said indicators for eliminating false signaling or glitches and hold violations due to best case delays, caused due to skewed clock signals.

According to a further aspect an integrated circuit is provided, said circuit comprising: a control unit, a coupling device and a programmable logic device or any combination thereof, in accordance with above discussion.

According to a further aspect a method for generating a control signal is provided, said method comprising the steps of: providing a series of registers, wherein each register of the series of registers providing an output; supplying a first clock signal to the first register of the series of registers and a second clock signal to remaining registers of the series of registers; supplying a plurality of indicators indicative of phase skew relation between said first clock signal and second clock signal; and, supplying selectively one of the outputs of the series of registers as a control signal, said control signal is adaptively adjusted according to the indicators, said control signal is adaptively adjusted for eliminating impact of the phase skew amongst the clock signals.

According to yet a further aspect a method for communicating data from a first programmable device and to a second programmable device is provided, said method comprising the steps of: introducing a first phase skew amongst a first clock signal or a second clock signal of the first programmable device and introducing another phase skew between a first clock signal or a second clock signal of the second programmable device; generating first control signal/s for selecting one of the inputs of a multiplexer of the first programmable device using a first control unit, said control unit receiving the first clock signal and the second clock signal of the first programmable device and a first plurality of indicators, said first plurality of indicators being indicative of a first phase skew relation between the first clock signal and the second clock signal of the first programmable device, and generating second control signal/s for selecting one of the outputs of a de-multiplexer of the second programmable device using a second control unit, said control unit receiving the first clock signal and the second clock signal of the second programmable device and a second plurality of indicators, said second plurality of indicators being indicative of a second phase skew relation between the first clock signal and the second clock signal of the second programmable device, said control signal/s are adaptively adjusted for eliminating impact of the phase skew amongst the clock signals; and communicating data via selected input of the multiplexer to the selected output of the de-multiplexer. The step of determining comprises: determining a plurality of timing parameters, said timing parameters being indicative of time required for data communication amongst elements of each programmable device and/or time required for communicating data from an output pin of the first programmable device to an input pin of the second programmable device or any combination thereof, and; determining a first shift-value and a second shift-value along with polarity and whether to apply on first or second clock signal, using said timing parameters. The step of introducing comprises: introducing the first phase skew by an amount and polarity determined by the first shift-value on first or second clock signal and includes step of introducing the second phase skew by an amount and polarity determined by the second shift-value on either first or second clock signal, of the corresponding programmable device. The step of determining also includes steps of coupling indicator inputs of the control unit to functional pins of the respective programmable device. The step of introducing also includes decoupling indicators of the control units from functional pins and coupling them to logic states that are indicative of phase skew relation between the respective clock signals of the programmable device. The method further comprises steps of communicating data directly amongst said programmable devices directly via one or more delay elements.

According to a still another aspect a computer program product to be loaded by a computer arrangement, comprising instructions for communicating data from a first programmable device to a second programmable device, the computer arrangement comprising a processing unit and a memory, the computer program product, after being loaded, providing said processing unit with the capability to carry out the steps according to above discussion.

According to another aspect a method for implementing a system, said system being capable of supporting data communication using skewed clock signals amongst programmable devices, said device being the device discussed earlier, said method being implementable in electronic design automation (EDA) tools is provided and said method comprising steps of: synthesizing logic and checking condition if said logic is implementable on a single programmable device and performing following steps if said condition not being true; checking condition if input/output pin requirement of the logic is more than physically present input/output pins on the programmable device and performing following steps if said condition being true; multiplexing/de-multiplexing logic inputs/outputs using the control units for allowing time division multiplexing between the inputs/outputs of logic; coupling control unit indicators of each programmable device to a plurality of functional pins of respective programmable device; supplying delay elements preceding to the input/output pins of the programmable devices that are not multiplexed; partitioning logic, performing synthesis, place and route for implementing said logic in a plurality of programmable devices; determining a plurality of timing parameters, said timing parameters being indicative of time required for data communication amongst elements of each programmable device and/or time required for communicating data from an output pin of a programmable device to an input pin of other programmable device or any combination thereof; determining a phase shift-value along with polarity and whether to apply on first or second clock signal, for each programmable device; shifting said first or second clock signal of each programmable device by an amount and polarity determined by the phase shift-value for respective programmable device, and; decoupling control unit indicators from the functional pins and coupling them to a plurality of logic states, said plurality of logic states together being indicative of a phase skew relation between the first clock signal and the second clock signal of respective programmable devices.

BRIEF DESCRIPTION OF THE DRAWINGS

The invention will now be described with reference to accompanying drawings, therein.

DETAILED DESCRIPTION OF THE INVENTION

In the following detailed description of the various embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

It is to be noted that the invention hereinafter is being described with reference to FPGAs, however a person skilled in the art will appreciated that embodiments of the invention are possible using other programmable devices. The devices may include Complex Programmable Logic Devices (CPLDs), Programmable Logic Arrays (PLAs) and other programmable devices. Any such variation or embodiment is a subject matter of protection under this patent.

Figure 1:
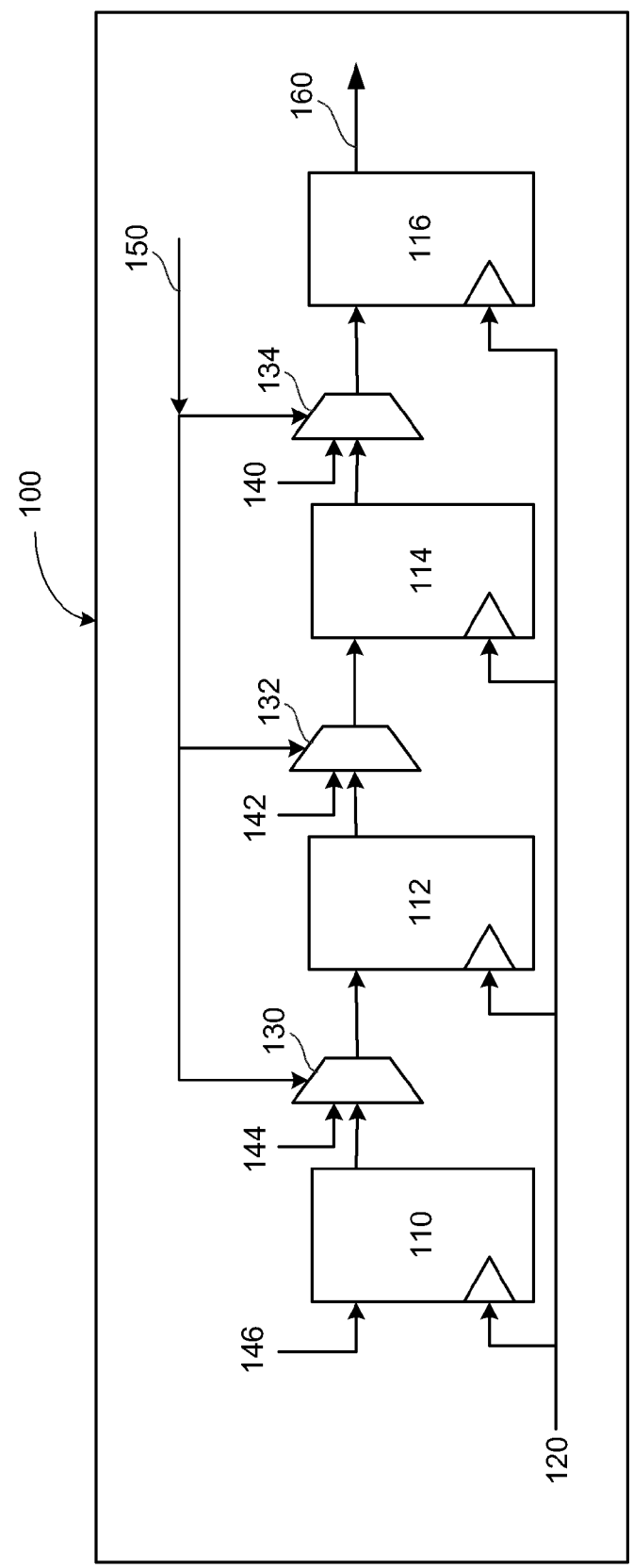
FIG. 1 shows a shift register based 4:1 multiplexer unit according to an embodiment of the present subject matter.
Figure 2:
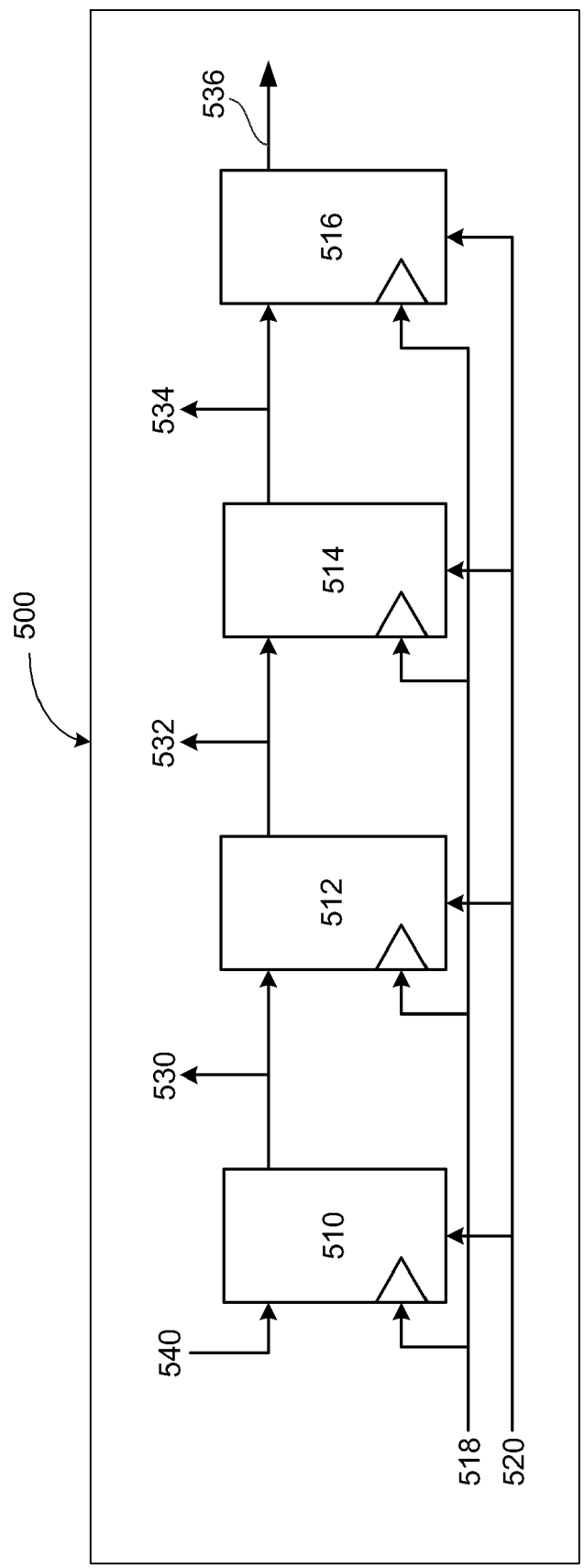
FIG. 2 shows a shift register based 1:4 de-multiplexer unit.

FIG. 1 and FIG. 2 show shift register based multiplexer and de-multiplexer units. Also multiplexer and de-multiplexer units can be designed using combinatorial gates and/or registers. There are many variants of multiplexer/de-multiplexer unit designs, but broadly falls into one of the two types mentioned here.

FIG. 1 shows a conventional 4:1 shift register based multiplexer unit 100. The multiplexer 100 comprises a series of registers 110, 112, 114 and 116. The registers are supplied with a clock signal 120. The inputs of registers 112, 114, and 116 are provided with 2:1 multiplexers 130, 132 and 134. Each 2:1 multiplexer 130, 132 and 134 receives inputs from the output of preceding register and the input 140, 142 and 144 of the 4:1 multiplexer unit 100. A control signal 150 either selects loading of the inputs 140, 142 and 144 of the 4:1 multiplexer 100 into respective registers or selects output of the preceding register to provide it at the input of the respective register for shifting. Thus this control signal performs load/shift operation. The other input 146 of the 4:1 multiplexer is directly connected to 110 register. The output 160 of the register 116 provides output of the multiplexer unit 100.

Another embodiment of multiplexer unit can be designed using combinatorial gates and a register. This multiplexer unit will have a multiplexer built with combinatorial gates. And the output of this multiplexer is connected to a register. This multiplexer unit requires $Log_2 N$ control signals to select one of the N inputs. It should be noted that if $Log_2 N$ value is not an integer, it should be rounded to next integer value by adding 1 and discarding fraction part.

FIG. 2 shows a shift register based 1:4 de-multiplexer unit 500. The de-multiplexer unit 500 includes serially coupled registers 510, 512, 514 and 516. Each register receives clock signal 518 and clock enable signal 520 as inputs. The clock enable signal is a control signal which will control shift operation through the shift register chain. The de-multiplexer input 540 is received at the input of register 510 and received input is selectively provided at one of the output 530, 532, 534 or 536 of one of the series of registers.

Another embodiment of de-multiplexer unit can be designed using registers. This de-multiplexer unit will have N registers, where N is a number of signals being de-multiplexed. The input of all these N registers are connected to de-multiplexer input signal. This de-multiplexer unit requires N control signals to select and route de-multiplexer input to one of the N outputs by connecting control signals as register clock enables.

Figure 3:
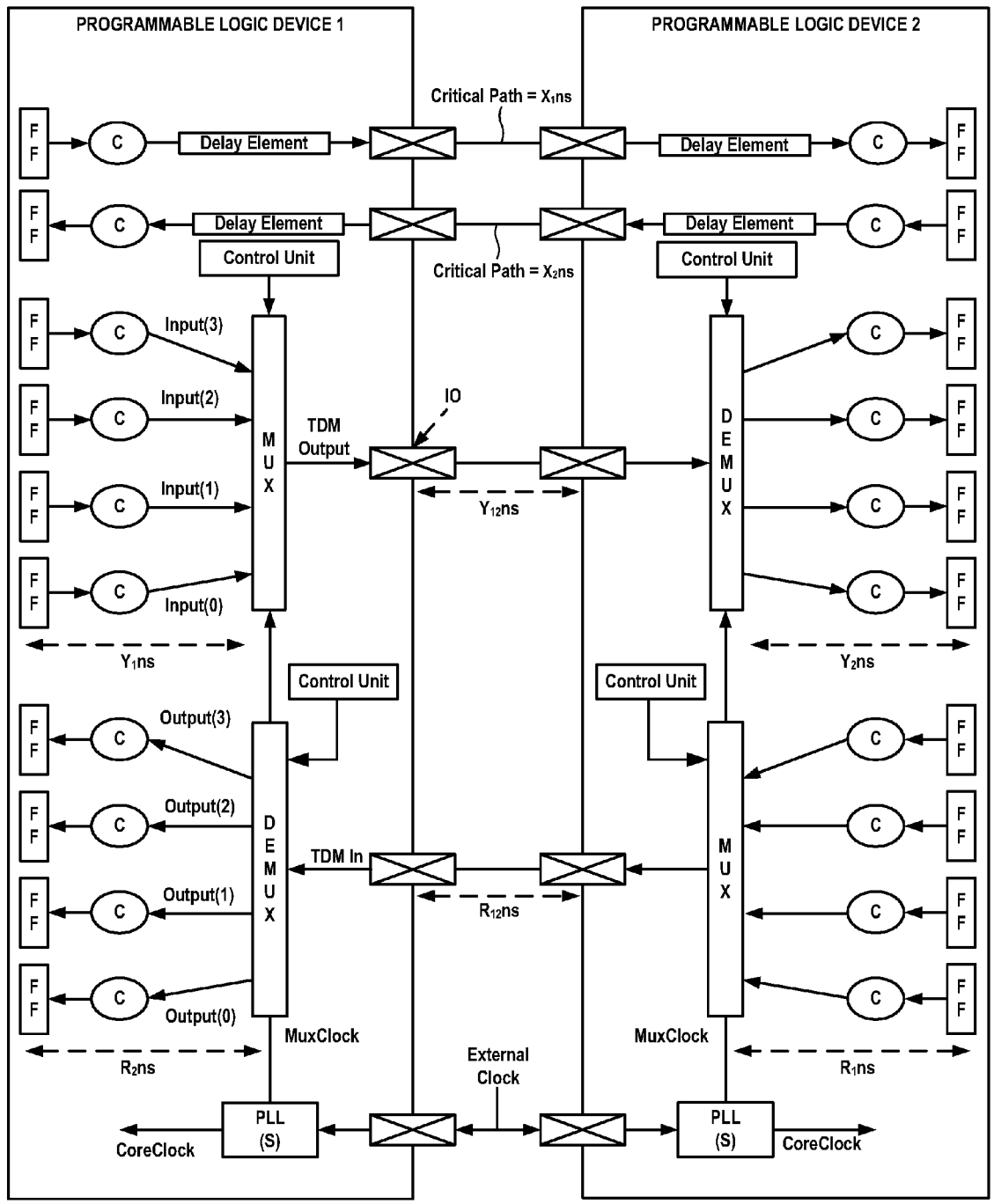
FIG. 3 a multi-FPGA logic partitioning of ASIC/SoC.
Figure 4:
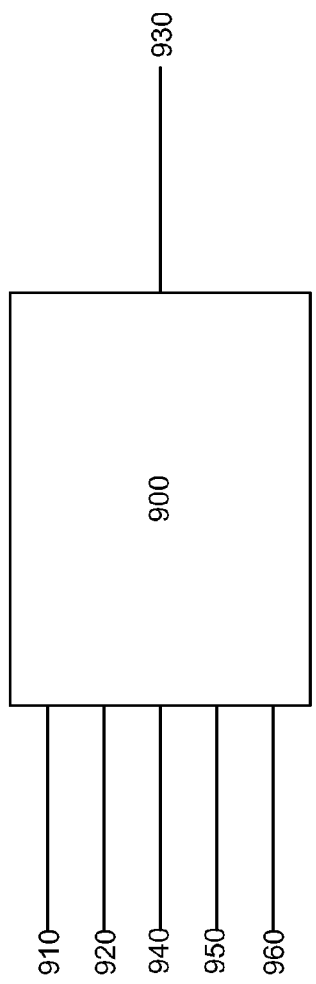
FIG. 4 shows a block diagram of a general control unit according to an embodiment of the present subject matter.

FIG. 3 shows a typical Multi-FPGA (FPGA1 and FPGA2) logic partitioning of ASIC/SoC design. Logic partitioning results in various inter-FPGA paths; first hardwire paths which are dedicated inter-FPGA connections without any pin multiplexing and second type of connections are with time division multiplexing. The invention provides a control unit (shown in FIG. 4) implemented in the FPGAs. The control unit is capable of receiving at least two clock signal inputs and indicators, said indicators being indicative of the phase skew relation amongst received clock signal inputs. The control unit being capable of generating an adaptively adjusted control signal/s for selecting one of inputs or outputs of the multiplexer or the de-multiplexer, using said indicators and clock signal inputs. The control signal/s are adaptively adjusted according to the indicators for avoiding false signaling or glitches and hold violations due to best case delays, caused due to skewed clock signals. FIG. 4 shows schematic diagram of the control unit 900. The control unit receives at least two clock signal inputs, one of the clock signals being a CoreClock signal 910 and another being a MuxClock signal 920. The CoreClock signal 910 is used by the FPGA logic and second clock signal MuxClock 920 is used by multiplexer or de-multiplexer of the FPGA. The control unit receives indicators 940, 950 and 960 and provides the control signal/s 930. The first indicator 940 indicates a positive or no shift in either MuxClock or CoreClock phase. The second indicator 950 indicates a negative or no shift in either MuxClock or CoreClock phase. The third indicator 960 indicates which out of the CoreClock or the MuxClock signal has been shifted. More details and function of the control unit 900 will be discussed later.

Figure 5:
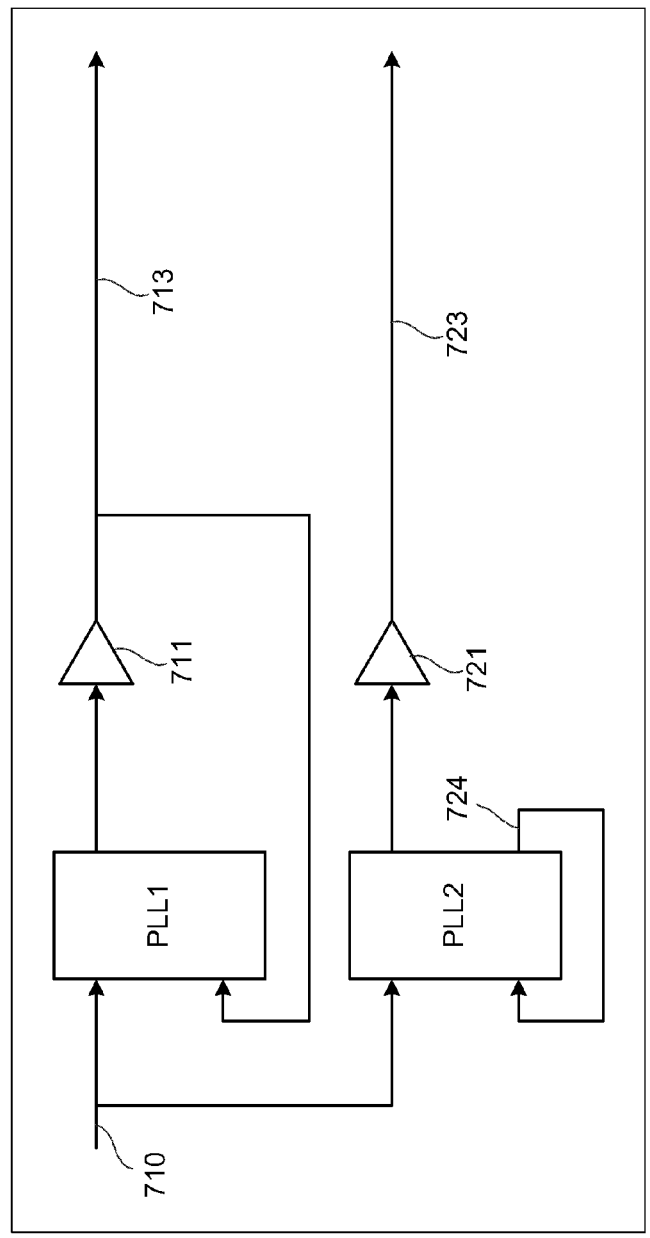
FIG. 5 shows a clock generation circuit.

As shown in the FIG. 3, external clock signal (preferably same frequency as that of MuxClock signal) can be fed on to both the FPGAs and all other clocks may be derived in the FPGA to maintain system synchronism. In this figure legends representation is as follows, FF: Flip-Flop or register; Combo, C: Combinatorial logic gates; IO: Input/Output Pin; MUX: FPGA Pin Time division multiplexer unit or coupling unit; DEMUX: FPGA Pin de-multiplexer unit or coupling unit and PLL: Phase Locked Loop. The analog or digital PLL normally available in the FPGA can be used for generating required clocks. A typical PLL based clock generation circuit that can be built inside the FPGA is shown in FIG. 5. Various path delays for the FPGAs of FIG. 3 can be identified as follows.

The inter-FPGA delay is sum of FPGA1 output offset delay, board trace delay and FPGA2 input offset delay. FIG. 3 shows intra-FPGA critical path delay as $X_1$ and $X_2$ ns in FPGA1 and FPGA2 respectively. Inter-FPGA critical forward path (from source FPGA1 to destination FPGA2) delay before TDM is Yns. Similarly, critical reverse path (from source FPGA2 to destination FPGA1) delay before TDM is Rns. After TDM, the forward and reverse path delays can be divided as shown in below equations.

$Y=Y_1$ (Sliced Combinatorial logic delay in FPGA1 including multiplexer unit)+$Y_{12}$ (Interconnect Board trace delay and FPGA1/2 IO delay)+$Y_2$ (Sliced Combinatorial logic delay in FPGA2 including de-multiplexer unit delay)

$R=R_1$ (Sliced Combinatorial logic delay in FPGA2 including multiplexer unit delay)+$R_{12}$ (Interconnect Board trace delay and FPGA 1/2 IO delay)+ $R_2$ (Sliced Combinatorial logic delay in FPGA1 including de-multiplexer unit delay)

Though Y is the forward critical path before TDM, it is not necessary that $Y_1$ and $Y_2$ of the same path will be having maximum sliced combinatorial logic delay in FPGA1 and FPGA2 respectively after TDM. Similarly though R is the reverse critical path before TDM, it is not necessary that $R_1$ and $R_2$ of the same path will be having maximum sliced combinatorial logic delay in FPGA2 and FPGA1 respectively after TDM. The same also applies to the board trace delays. It is not necessary that $Y_{12}$ and $R_{12}$ of the same paths will be having maximum board trace delays between FPGA1/2 to FPGA2/1 after TDM. Let us say in forward path, $Y_A$ and $Y_B$ are maximum TDM sliced combinatorial logic delays in FPGA 1 and FPGA 2 respectively. And in the reverse path, $R_A$ and $R_B$ are maximum TDM sliced combinatorial logic delays in FPGA2 and FPGA1 respectively. Similarly $Y_{AB}$ and $R_{AB}$ are maximum board trace delay between FPGA1/2 to FPGA2/1 respectively. The $X_1$, $X_2$, $Y_A$, $Y_B$, $R_A$, $R_B$, $Y_{AB}$ and $R_{AB}$ values for shift register based multiplexer/de-multiplexer unit can be determined by extraction of timing information as given in Table 1 from Static Timing Analysis (STA) of FPGA1 and FPGA2 on post Place and Routed database. It should be noted that the said timing parameters are worst case timing parameters.

TABLE 1

| FPGA Number | Worst case (Register or IO) to (IO or Register) timing paths | | Timing Parameter |
|---|---|---|---|
| | From Clock domain | To Clock domain | |
| 1 | CoreClock | CoreClock | $X_1$ |
| 1 | CoreClock | MuxClock driven multiplexer unit register inputs | $Y_A$ |
| 1 | MuxClock | CoreClock driven de-multiplexer unit register outputs | $R_B$ |
| 2 | CoreClock | CoreClock | $X_2$ |
| 2 | CoreClock | MuxClock driven multiplexer unit register inputs | $R_A$ |
| 2 | MuxClock | CoreClock driven de-multiplexer unit register outputs | $Y_B$ |
| 1 to 2 | FPGA1 MuxClock driven Register to IO delay + Interconnect Board trace delay + IO to FPGA2 MuxClock driven Register delay | | $Y_{AB}$ |
| 2 to 1 | FPGA2 MuxClock driven Register to IO delay + Interconnect Board trace delay + IO to FPGA1 MuxClock driven Register delay | | $R_{AB}$ |

The board traces delay can be generated from board level Place and Route Electronic Design Automation (EDA) tool into a delay file. The necessary board trace delay values can be extracted from such a file.

For combinatorial gates and/or registers based multiplexer/de-multiplexer unit, various timing parameters can be found in similar way described above except $Y_A$, $Y_B$, $R_A$ and $R_B$ values. For deriving these parameters, STA can be done by specifying source or destination register instance names.

$Y_A$=MAX Delay of [CoreClock driven Registers to multiplexer Input(3) Registers, {CoreClock driven Registers to multiplexer Input(2) Registers}/2, {CoreClock driven Registers to multiplexer Input(1) Registers}/3, {CoreClock driven Registers to multiplexer Input(0) Registers}/4] in FPGA1

$Y_B$=MAX Delay of [de-multiplexer Output(0) Registers to CoreClock driven Registers, {de-multiplexer Output(1) Registers to CoreClock driven Registers}/2, {de-multiplexer Output(2) Registers to CoreClock driven Registers}/3, {de-multiplexer Output(3) Registers to CoreClock driven Registers}/4] in FPGA2

$R_A$=MAX Delay of [CoreClock driven Registers to multiplexer Input(3) Registers, {CoreClock driven Registers to multiplexer Input(2) Registers}/2, {CoreClock driven Registers to multiplexer Input(1) Registers}/3, {CoreClock driven Registers to multiplexer Input(0) Registers}/4] in FPGA2

$R_B$=MAX Delay of [de-multiplexer Output(0) Registers to CoreClock driven Registers, {de-multiplexer Output(1) Registers to CoreClock driven Registers}/2, {de-multiplexer Output(2) Registers to CoreClock driven Registers}/3, {de-multiplexer Output(3) Registers to CoreClock driven Registers}/4] in FPGA1

The multiplexer/de-multiplexer Input/Output signals {Input(3), Input(2), Input(1), Input(0), Output(3), Output(2), Output(1) and Output(0)} referred in above equations are shown in FIG. 3.

Generally, if these critical paths are to be time division multiplexed (TDM) with Pin multiplexing Ratio (PMR), the worst case overall FPGA prototype/emulation frequency achievable is $1/(MAX((X_1 \text{ OR } X_2) \text{ OR } (Y_A \text{ OR } Y_{AB} \text{ OR } Y_B \text{ OR } R_A \text{ OR } R_B \text{ OR } R_{AB})*N))$ MHz, which is also called as emulation core clock (CoreClock) speed. The multiplexer/de-multiplexer unit high frequency MuxClock will be 1/(MAX ($X_1$/N OR $Y_A$ OR $Y_{AB}$ OR $X_2$/N OR $Y_B$ OR $R_A$ OR $R_B$ OR $R_{AB}$)) MHz. Here N=PMR+Number of additional MuxClock cycles needed for multiplexer/de-multiplexer unit.

When TDM is applied to critical inter-FPGA paths, possible timing critical conditions are $Y_A > X_1$; $Y_B > X_2$; $R_A > X_2$; $R_B > X_1$, due to large combinatorial logic and route delays. Usually $Y_{AB}$ and $R_{AB}$ are much lesser than large combinatorial gate and route delays in FPGAs and usually they will not be limiting the system speed.

As per the present subject matter, higher overall emulation system frequency can be achieved under said timing critical conditions with following steps, which are explained in subsequent sections.

The method according to the present subject matter for data communication is implemented in following steps. The FPGAs are provided with the control units as shown in FIG. 4. The indicator inputs of the control unit are coupled to functional I/O pins of the FPGA. Various timing parameters referred above are computed. Once these delay values are available, magnitude of phase shift value for the CoreClock signal or MuxClock Signal of FPGA1 ($\delta_1$) and CoreClock signal or MuxClock signal of FPGA2 ($\delta_2$) can be determined as given in below algorithm:

---

If [($Y_A + R_B$) ≦ $2Yx_{max}$ AND ($Y_B + R_A$) ≦ $2Rx_{max}$]
   If ($Y_A$ OR $R_B > Yx_{max}$)
      |$\delta_1$| = [MAX ($Y_A, R_B$) −$Yx_{max}$−m] ns
   Else
      |$\delta_1$| = 0
   If ($Y_B$ OR $R_A > Rx_{max}$)
      |$\delta_2$| = [MAX ($Y_B, R_A$) −$Rx_{max}$−m] ns
   Else
      |$\delta_2$| = 0
   f = [1/ ((MAX ($Yx_{max}, Rx_{max}$) +m)*N)] MHz
   p = [(MAX ($Y_{max}, R_{max}$) − MAX ($Yx_{max}, Rx_{max}$)−m)/ (MAX ($Yx_{max}, Rx_{max}$) +m)]*100%
Else
If (($Y_A + R_B$) > $2Yx_{max}$ AND ($Y_B + R_A$) ≦ $2Rx_{max}$)
   |$\delta_1$| = [(ABS ($Y_A − R_B$)−m)/2] ns
   If ($Y_B$ OR $R_A > Rx_{max}$)
      |$\delta_2$| = (MAX ($Y_B, R_A$) −$Rx_{max}$−m) ns
   Else
      |$\delta_2$| = 0
   f = MIN [1/ ((MAX ($Y_A, R_B$)−|$\delta_1$|+m)*N), 1/ ((MAX ($Y_B, R_A$)−|$\delta_2$|+m)*N)] MHz
   p = MIN [(|$\delta_1$|/ (MAX ($Y_A, R_B$)−|$\delta_1$|+m)), (|$\delta_2$|/ (MAX ($Y_B, R_A$)−|$\delta_2$|+m))]*100%
Else
If [($Y_A + R_B$) ≦ $2Yx_{max}$ AND ($Y_B + R_A$) > $2Rx_{max}$]
   If ($Y_A$ OR $R_B > Yx_{max}$)
      |$\delta_1$| = (MAX ($Y_A, R_B$) −$Yx_{max}$−m) ns
   Else
      |$\delta_1$| = 0
   |$\delta_2$| = [(ABS ($Y_B − R_A$)−m)/2] ns
   f = MIN [1/ ((MAX ($Y_A, R_B$)−|$\delta_1$|+m)*N), 1/ ((MAX ($Y_B, R_A$)−|$\delta_2$|+m)*N)] MHz
   p = MIN [((|$\delta_1$|/ (MAX ($Y_A, R_B$)−|$\delta_1$|+m)), (|$\delta_2$|/ (MAX ($Y_B, R_A$)−|$\delta_2$|+m)))]*100%
Else
If (($Y_A + R_B$) > $2Yx_{max}$ AND ($Y_B + R_A$) > $2Rx_{max}$)
   |$\delta_1$| = [(ABS ($Y_A − R_B$)−m)/2] ns
   |$\delta_2$| = [(ABS ($Y_B − R_A$)−m)/2] ns
   f = MIN [2/ (($Y_A + R_B + 3m$)*N), 2/ (($Y_B + R_A + 3m$)*N)] MHz
   p = MIN [((ABS ($Y_A − R_B$)−m)/ ($Y_A + R_B + 3m$)), ((ABS ($Y_B − R_A$)−m)/ ($Y_B + R_A + 3m$))]*100%
Where,
$X_{max}$ = MAX ($X_1, X_2$)
$Y_{max}$ = MAX ($Y_A, Y_B$)
$R_{max}$ = MAX ($R_A, R_B$)
Margin (m) = Clock line skew uncertainty in FPGA + PLL Phase shift minimum step
N = PMR + Number of additional cycles needed for multiplexer/de-multiplexer unit $\delta_1$ = Phase shift to be introduced in FPGA1
$\delta_2$ = Phase shift to be introduced in FPGA2
$Yx_{max}$ = MAX ($X_{max}, Y_{AB}$)
$Rx_{max}$ = MAX ($X_{max}, R_{AB}$)
ABS = Absolute value function
MAX = Maximum value function
MIN = Minimum value function
f = Improved overall prototype/emulation (CoreClock) frequency in MHz
MuxClock frequency = f*N
p = Prototype/Emulation frequency percentage improvement

---

Above computations provide magnitude of the phase shift value that has to be introduced in both the FPGAs along with the percentage improvement in the prototype/emulation frequency. However, a person skilled in the art will appreciate for the purpose of implementing the invention computation of p is not mandatory. As shown in the equations for p, the overall prototype/emulation frequency percentage improvement remains same with any number of pins being multiplexed using multiplexer/de-multiplexer unit, as there is no dependency on N.

Further polarity (positive, negative or none) of the phase shift and whether to apply phase shift on MuxClock signal or CoreClock signal can be determined according to Table 2. In the table, if polarity shown on a particular clock is negative or positive means that negative or positive phase shift shall be introduced respectively on that clock by the amount given. If the phase shift is shown as 0 means that there is no phase shift on that particular clock.

TABLE 2

| Sr. No. | Conditions | FPGA1 Phase shift | | FPGA2 Phase shift | |
|---|---|---|---|---|---|
| | | CoreClock | MuxClock | CoreClock | MuxClock |
| 1 | $Y_A > Yx_{max}$, $R_B < Y_A$ and $Y_B > Rx_{max}$, $R_A < Y_B$ | −$\delta_1$ | 0 | +$\delta_2$ | 0 |
| 2 | $Y_A < Yx_{max}$, $R_B < Y_A$ and $Y_B > Rx_{max}$, $R_A < Y_B$ | 0 | 0 | +$\delta_2$ | 0 |
| 3 | $Y_A > Yx_{max}$, $R_B < Y_A$ and $Y_B < Rx_{max}$, $R_A < Y_B$ | −$\delta_1$ | 0 | 0 | 0 |
| 4 | $Y_A > Yx_{max}$, $R_B < Y_A$ and $R_A > Rx_{max}$, $R_A > Y_B$ | −$\delta_1$ | 0 | −$\delta_2$ | 0 |
| 5 | $Y_A < Yx_{max}$, $R_B < Y_A$ and $R_A > Rx_{max}$, $R_A > Y_B$ | 0 | 0 | −$\delta_2$ | 0 |
| 6 | $Y_A > Yx_{max}$, $R_B < Y_A$ and $R_A < Rx_{max}$, $R_A > Y_B$ | −$\delta_1$ | 0 | 0 | 0 |
| 7 | $Y_A > Yx_{max}$, $R_B < Y_A$ and $R_A > Rx_{max}$, $R_A > Y_B$ | 0 | +$\delta_1$ | 0 | +$\delta_2$ |
| 8 | $R_B > Rx_{max}$, $R_B > Y_A$ and $Y_B > Yx_{max}$, $R_A < Y_B$ | +$\delta_1$ | 0 | +$\delta_2$ | 0 |
| 9 | $R_B < Yx_{max}$, $R_B > Y_A$ and $Y_B > Rx_{max}$, $R_A < Y_B$ | 0 | 0 | +$\delta_2$ | 0 |
| 10 | $R_B > Yx_{max}$, $R_B > Y_A$ | +$\delta_1$ | 0 | 0 | 0 |

TABLE 2-continued

| Sr. No. | Conditions | FPGA1 Phase shift | | FPGA2 Phase shift | |
|---|---|---|---|---|---|
| | | CoreClock | MuxClock | CoreClock | MuxClock |
| | and $Y_B < Rx_{max}$, $R_A < Y_B$ | | | | |
| 11 | $R_B > Yx_{max}$, $R_B > Y_A$ and $Y_B > Rx_{max}$, $R_A < Y_B$ | 0 | $-\delta_1$ | 0 | $-\delta_2$ |
| 12 | $R_B > Yx_{max}$, $R_B > Y_A$ and $R_A > Rx_{max}$, $R_A > Y_B$ | $+\delta_1$ | 0 | $-\delta_2$ | 0 |
| 13 | $R_B < Yx_{max}$, $R_B > Y_A$ and $R_A > Rx_{max}$, $R_A > Y_B$ | 0 | 0 | $-\delta_2$ | 0 |
| 14 | $R_B > Yx_{max}$, $R_B > Y_A$ and $R_A < Rx_{max}$, $R_A > Y_B$ | $+\delta_1$ | 0 | 0 | 0 |

It should be noted that the conditions shown in Sr. No. 7 and 11 of Table 2 are same as that of Sr. No. 4 and 8 respectively. However phase shifts shown are different, as there are two possible ways of achieving same benefits. It is preferred to use Sr. No. 4 and 8 instead of Sr. No. 7 and 11 unless condition $\delta_1 = \delta_2$ is satisfied. These algorithms also ensure that no relative phase shift introduced on high frequency MuxClock signals of both the FPGAs, which will eliminate possible hold violations between FPGAs with best case delays.

Once computation of the delays, shift values and determination of the polarity of the phase shift and determination of which clock signal is to be shifted is done, the indicators of the control unit 900 are coupled to the logic state values according to Table 3.

TABLE 3

| Signal Name | Condition of multiplexer/de-multiplexer clock phase shifts | Logic state Value to be Programmed |
|---|---|---|
| neg_shift Signal 950 of control unit 900 | Phase shift on MuxClock/CoreClock is positive (OR) No Shift | 0 |
| | Phase shift on MuxClock/CoreClock is negative | 1 |
| pos_shift Signal 940 of control unit 900 | Phase shift on MuxClock/CoreClock is negative (OR) No Shift | 0 |
| | Phase shift on MuxClock/CoreClock is positive | 1 |
| shift_clk Signal 960 of control unit 900 | Either positive or negative phase shift on MuxClock | 1 |
| | Either positive or negative phase on CoreClock | 0 |

The clock skew indicators are connected to functional IOs, such that during synthesis process the control logic is retained and while computing delays the control unit delays are also accounted. The said functional IOs are input/output pins of the FPGA, which are already used for driving other functional inputs or outputs to/from the FPGA. After place and route, on the completion of delay computation and magnitude/polarity of clocks phase shift, the inputs of the control unit are decoupled from other functional IOs and coupled to an identified logic states according to Table 3.

The Phase of MuxClock signal or the CoreClock signal in both the FPGAs is controllably shifted (skewed) according to above computations using clock signal generating circuits. Typically, FPGAs include PLL circuit as clock signal generating circuit; alternatively, skewed clock signals may be supplied to the FPGAs from external source. One such PLL clock signal generation circuit is shown in FIG. 5. In FIG. 5, final output of PLL1 generates MuxClock signal and final output of PLL2 generates CoreClock signal with phase shift from an external clock input 710. The phase shifted clock output of the PLL1 is provided to a clock tree line 711 for generating a phase shifted MuxClock signal 713. The phase shifted Mux-Clock signal 713 is supplied back to the reference clock feedback input of the PLL1. Here the assumption is that external clock frequency is same as that of MuxClock signal. The phase shifted low frequency clock output of PLL2 by adjusting division factors of PLL is provided to a clock tree line 721 for generating a phase shifted CoreClock signal 723. An output clock signal 724 of PLL2, which has same frequency as that of input, is supplied as reference clock feedback input of the PLL2. Normally the phase shift increments of FPGA are provided as a fraction of input frequency or as fixed steps. Further, if only fixed phase shifts are supported by PLL, then the computed phase shift value is rounded to the nearest lower fixed phase shift value. This allows the data communication according to the invention without requiring any additional low skew clock lines. Notably no additional clock signal lines are required for implementing the invention as two clock lines are usually required even otherwise per FPGA. The said PLLs can be configured in post place and routed database with computed clock phase shift magnitude and polarity to generate desired phase shifted clocks.

Figure 6:
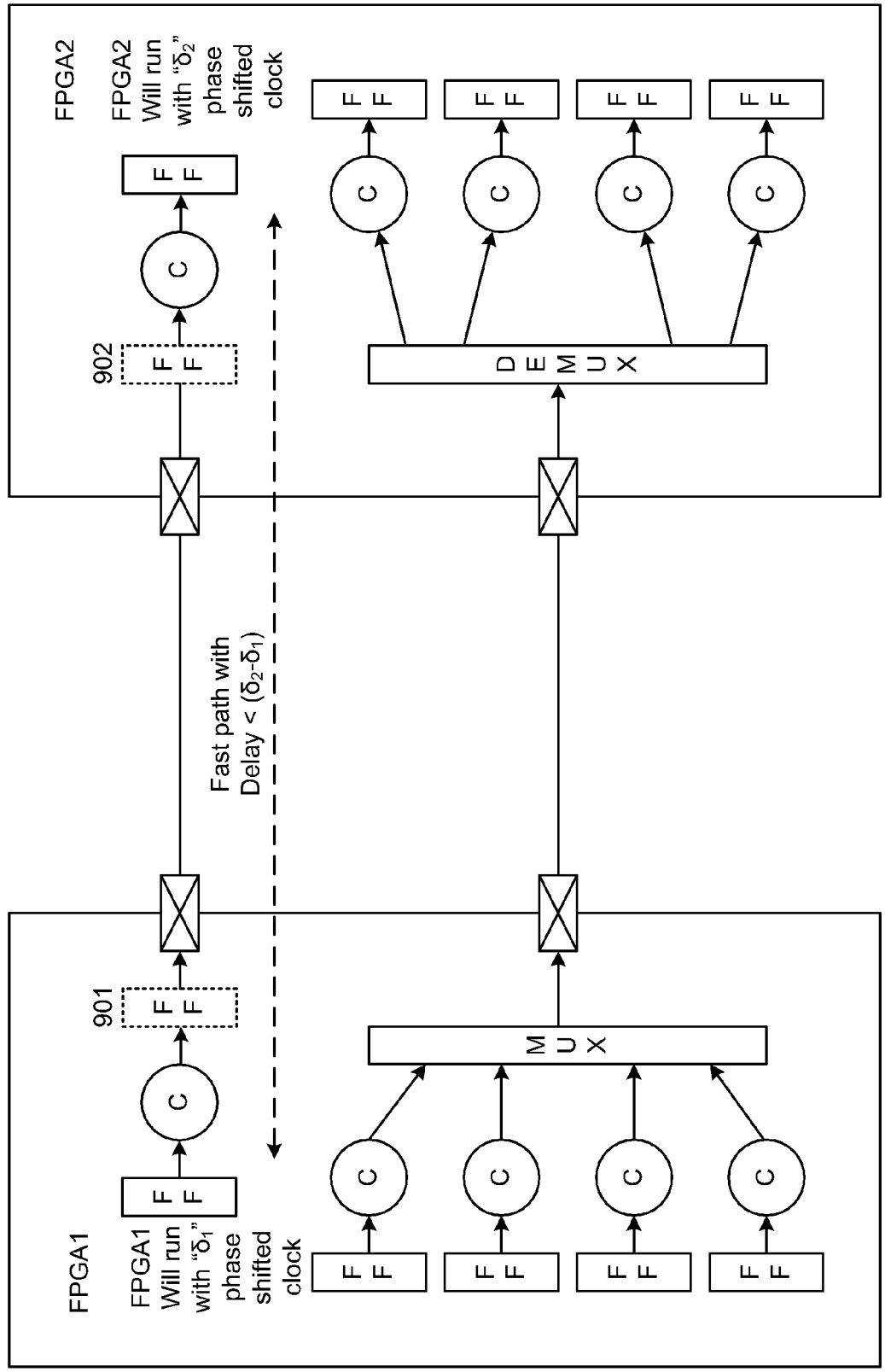
FIG. 6 shows inter-FPGA and non-multiplexed paths.

The adaptively adjusted control signal/s generated by the control units of the multiplexer and de-multiplexer and phase shifted clock signals allows implementation of cycle-stealing techniques and thereby allows data communication without any false signal or glitches and hold violations due to best case delays, and therefore resulting in increased operating frequency. For ensuring a foolproof communication of data from one FPGA to another FPGA it is important that the data from not only multiplexed paths but also from dedicated non-multiplexed paths (shown in FIG. 6) are communicated correctly. Following discussion addresses communication of data over dedicated non-multiplexed paths when clock signals have been skewed (or phase shifted).

A functional failure may be observed while communicating data over non-multiplexed dedicated inter-FPGA paths due to phase shifted clock signals, if such path delay is less than $|\delta_2 - \delta_1|$, where $|\delta_2 - \delta_1| > 0$. The functional failure would happen due to the signals getting latched in destination FPGA one clock cycle earlier than expected. This issue with faster paths can be eliminated by introducing additional registers clocked with MuxClock in driving (901) as well as receiving (902) FPGAs as shown in the FIG. 6. For the forward path, insertion of these registers will create additional paths from CoreClock to MuxClock in FPGA1 and MuxClock to CoreClock in FPGA2 and vice versa in reverse path. With registers insertion, the worst case delay on non-multiplexed inter-FPGA path can be up-to P cycles (combined delay in FPGA1, board and FPGA2) and can be declared as multi-cycle path, P being a number of input/output signals that are being multiplexed/de-multiplexed by the multiplexer/de-multiplexer unit.

Now the control unit shown in FIG. 4 will be described in more detail. It should be noted that the control units in the following discussion are being described with reference to 4:1 multiplexer and 1:4 de-multiplexer, however a person skilled in art will appreciate that similar control units may be designed for other multiplexers or de-multiplexers, any such designs may vary with respect to number of logic elements and connection thereof, nevertheless concept of generating control signal/s using such control unit that accounts for any phase shift in MuxClock or CoreClock with respect to one another and generates the control signal/s that is independent of said phase shift.

Figure 7:
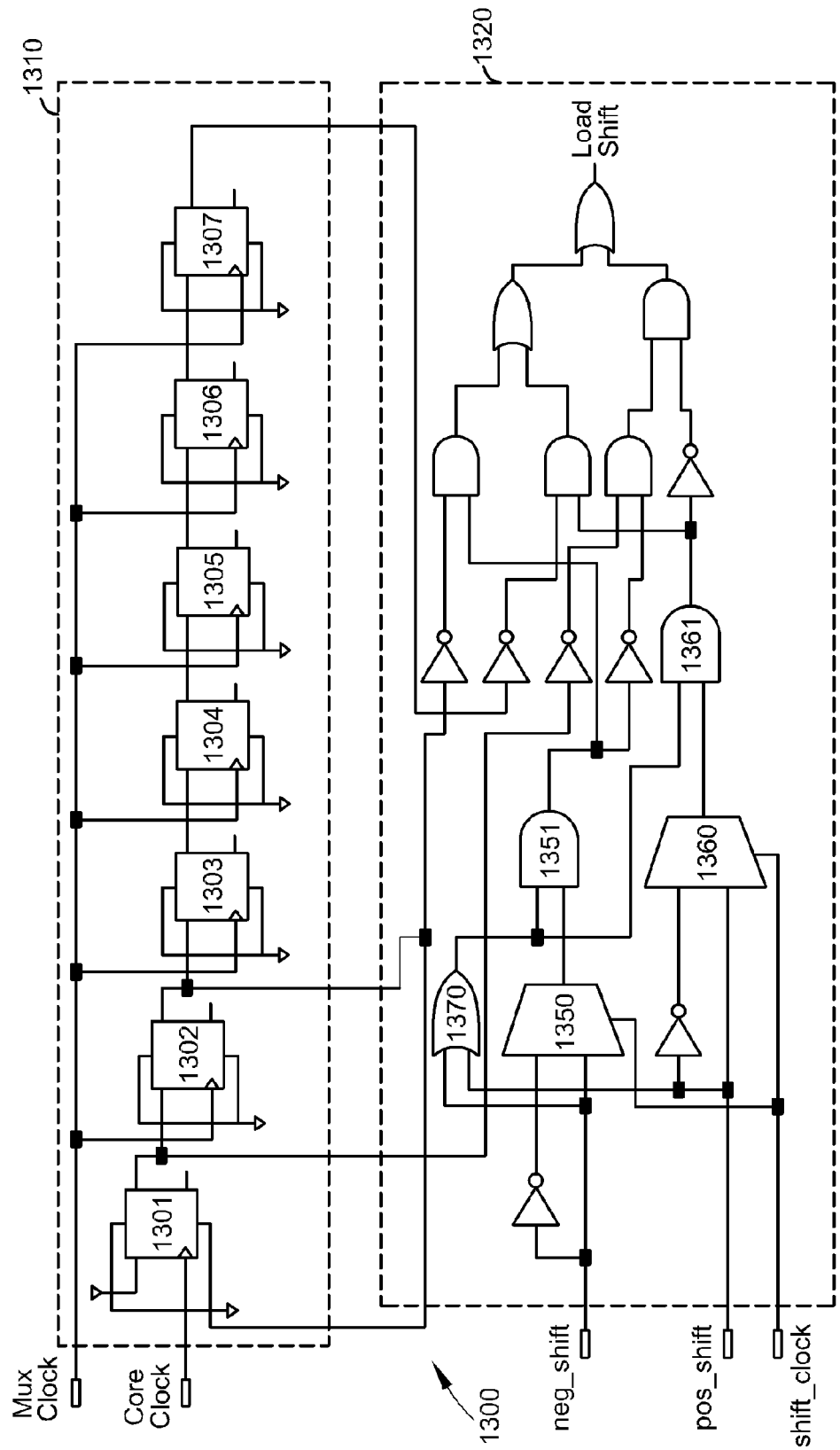
FIG. 7 to FIG. 10 show example embodiments of a control unit.
Figure 8:
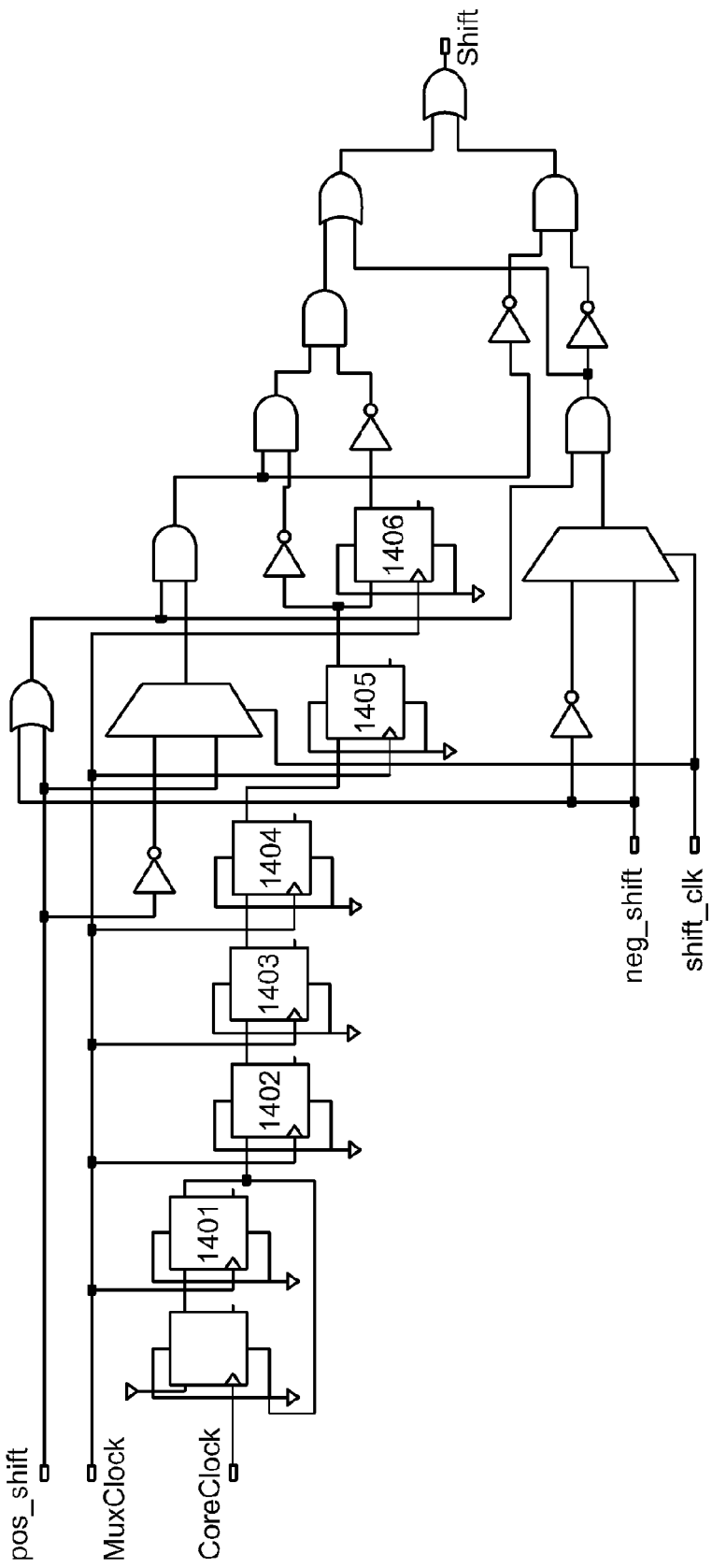
Figure 9:
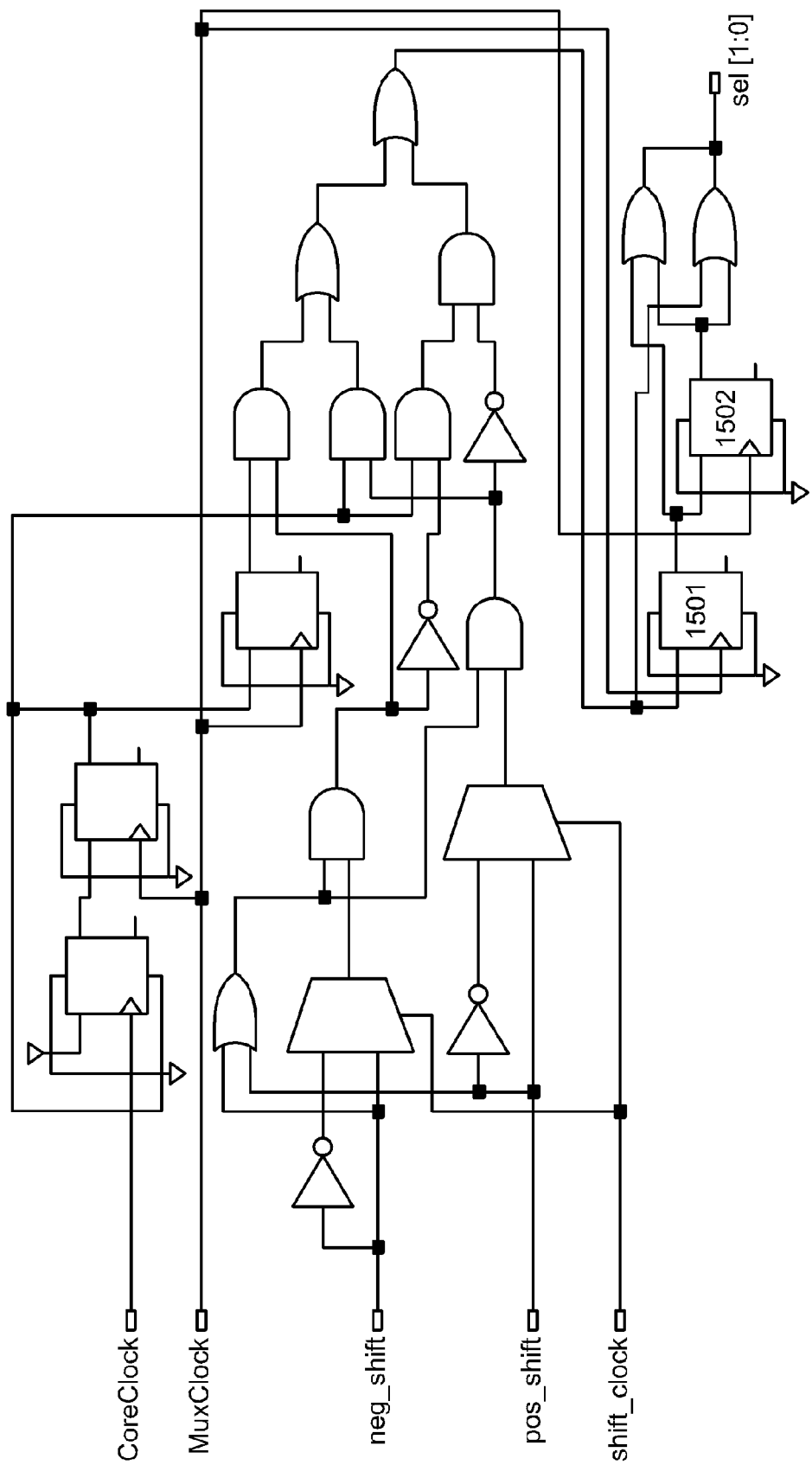
Figure 10:
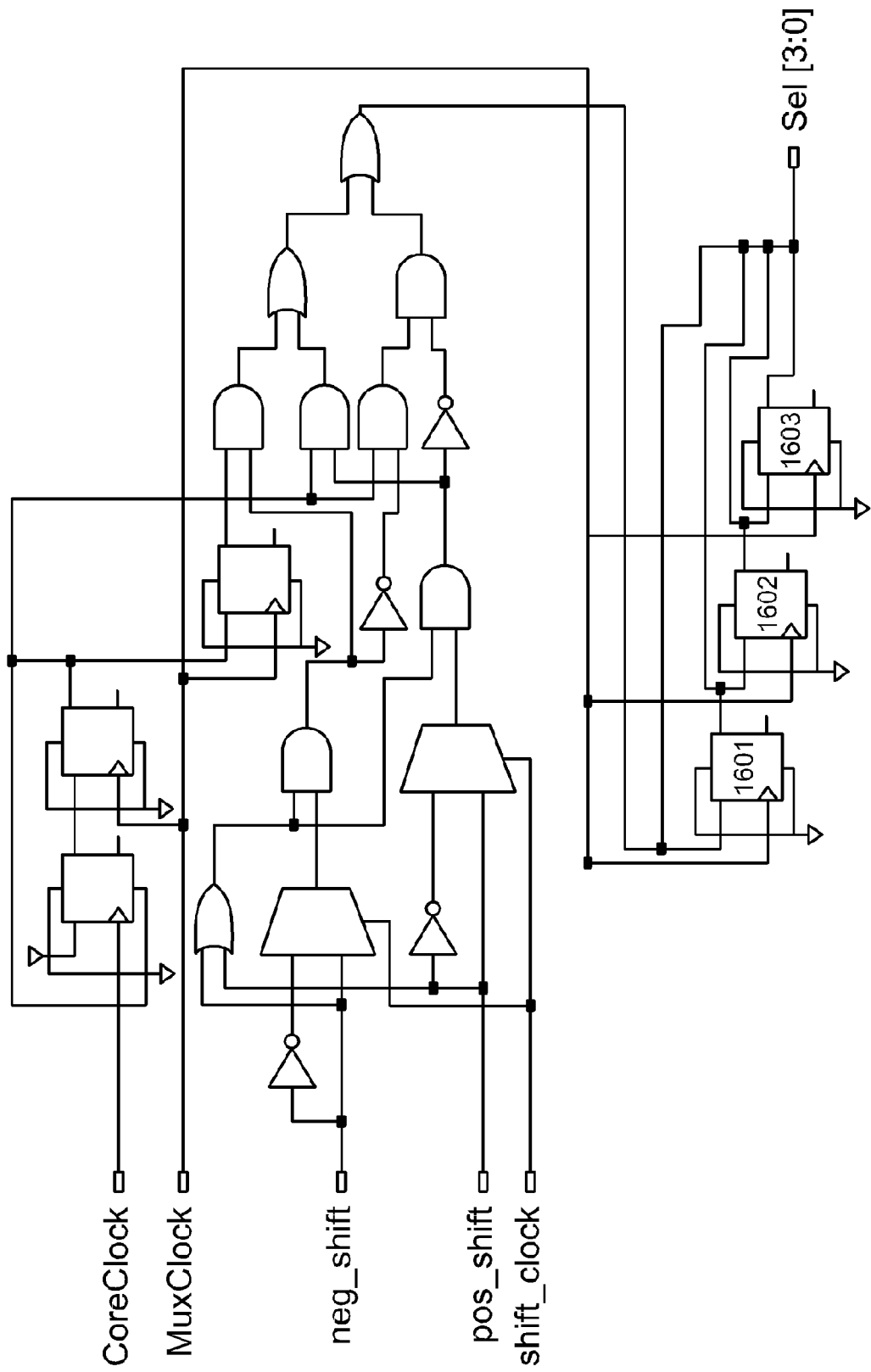

FIG. 7 to FIG. 10 show various embodiments of control unit. FIG. 7 is a control unit that can be used with a shift register based 4:1 multiplexer unit. FIG. 8 is a control unit for shift register based 1:4 de-multiplexer unit. FIG. 9 is a control unit for combinatorial gates and register based 4:1 multiplexer unit. FIG. 10 is a control unit for registers based 1:4 de-multiplexer unit. These control units receive clock signals CoreClock and MuxClock, and receive indicators, pos_shift, neg_shift and shift_clk. The control units are provided with indicators that indicate polarity of phase shift (by using pos_shift and neg_shift signals for positive or negative or no shift) and the clock signal that has been shifted (by using shift_elk signal). Further the control units shown in the figures include a series of shift registers. In a specific embodiment of 4:1 multiplexers or 1:4 de-multiplexers, the output of the second shift register is coupled to the clear or reset input of the first register. It should be noted that the configuration of the control units shown in FIG. 7 to FIG. 10 are illustrative only and are not limiting, a person skilled in the art will appreciate other embodiment for realizing control unit, which is capable of providing control signal/s which are adaptively adjusted (corrected) for undesired effects that may occur due to the phase shifting of the clock signals.

Further for the purpose of illustration control unit shown in FIG. 7 is being described in detail, the control units shown in FIG. 8 to FIG. 10 are self explanatory and can be understood on the same line while referring to respective figures.

Figure 11:
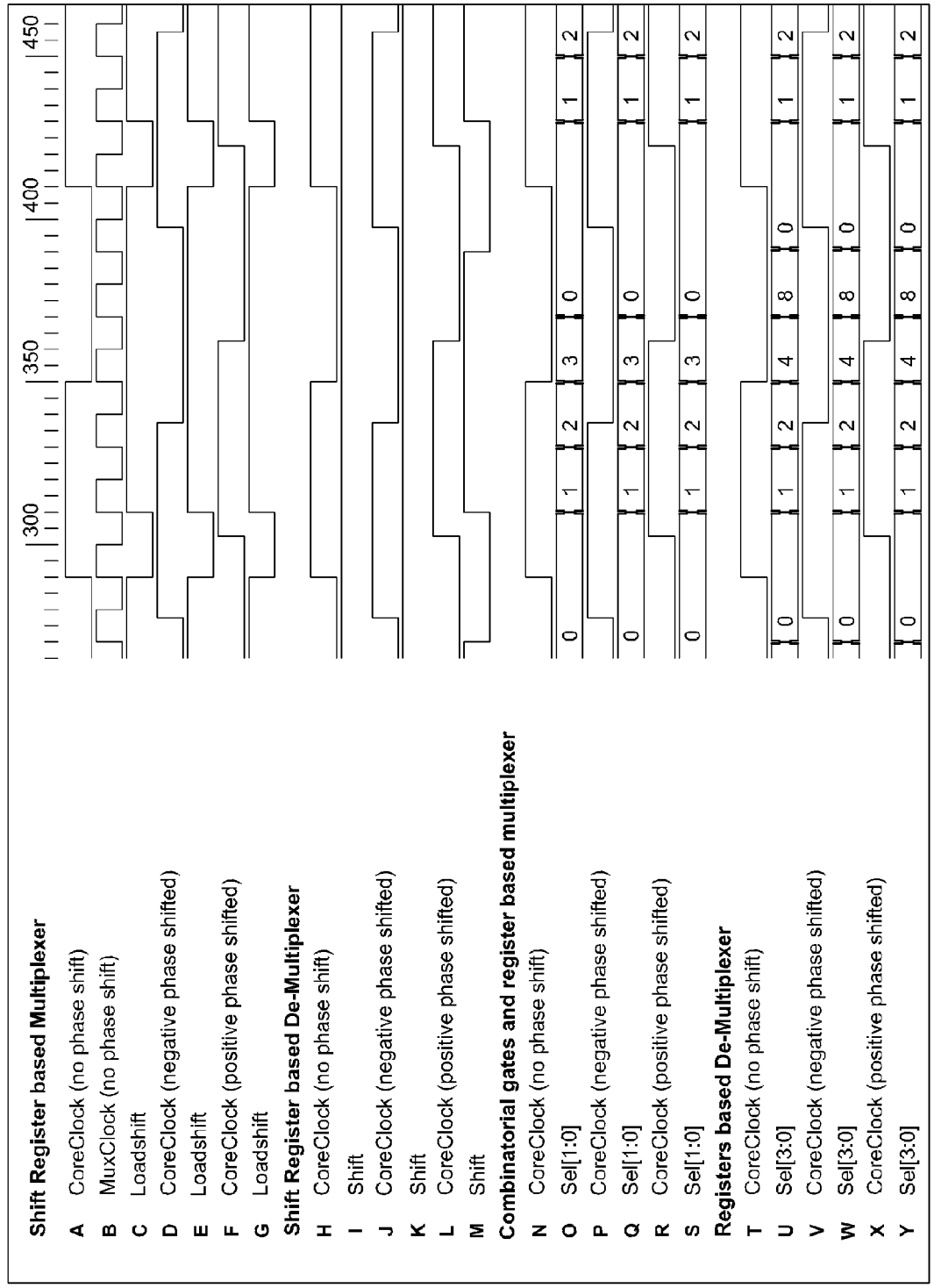
FIG. 11 shows timing diagram of control signal/s for the control units shown in FIG. 7 to FIG. 10.

FIG. 7 shows control unit 1300 for a shift register based 4:1 multiplexer unit. The control unit 1300 has a series of shift registers 1310. The series 1310 has registers 1301, 1302, 1303, 1304, 1305, 1306 and 1307. Each of these registers receives a MuxClock signal or CoreClock signal as shown in the figure. Further the control unit 1300 has a logic unit 1320 which receives inputs neg_shift, pos_shift and shift_clk. Said inputs to the logic unit 1320 being indicators, indicative of a phase skew relation amongst the CoreClock signal and MuxClock signal. The inputs neg_shift and pos_shift and their inverter logic state are supplied to multiplexers 1350 and 1360. The shift_clk is connected to select line of the multiplexers 1350 and 1360. The inputs neg_shift, pos_shift are further connected to an OR gate 1370. The output of the multiplexer 1350 and 1370 and output of 1360 and 1370 are logically-Anded using gates 1351 and 1361. The outputs of the 1351, 1361, their inverted signals and inverted signals of the outputs of the registers 1301, 1302 and 1307 are subsequently used to selectively provide a control signal "LoadShift", said control signal being adaptively adjusted for not being effected due to the clock signal skew. The said effects due to clock signal skew on control signal include reduced pulse width and/or arrival of one clock cycle earlier than expected and hold violations due to best case delays, which leads to wrong signaling and system malfunction. The said adaptive adjustment will ensure "LoadShift" pulse of one clock cycle width and always at same instance and eliminates possible hold violations due to best case delays irrespective of clock phase shifts. This control signal will be connected to signal 150 of shift register based 4:1 multiplexer unit shown in FIG. 1. The timing diagram of shift register based 4:1 multiplexer unit is shown in FIG. 11, signals "A" to "G" with shift_clock=0. In this figure signals "A" and "B" shown are CoreClock and MuxClock with no phase shift, whereas the "LoadShift" control signal generated with these clocks is shown as signal "C". The negative (with pos_shift=0 and neg_shift=1) and positive (with pos_shift=1 and neg_shift=0) phase shifted CoreClock is shown as signals "D" and "F", whereas generated "LoadShift" control signals are shown as signals "E" and "G" with the said clock phase shifts. As shown in the figure, said adaptive adjustment will ensure "LoadShift" pulse of one clock cycle width and always at same instance irrespective of clock phase shifts. Note that the control unit will generate exactly identical control signal with either negative/positive phase shift on CoreClock or positive/negative shift on MuxClock respectively. It should be noted that the output of the shift register 1302 is coupled to the clear or reset signal of register 1301 in FIG. 7.

FIG. 8 shows control unit for a shift register based 1:4 de-multiplexer. This control unit generates a control signal "Shift", said control signal being adaptively adjusted for not being effected due to the clock signal skew. If there is no phase shift in clocks, the "Shift" control signal can always allow shifting operation in shift register based de-multiplexer. However with phase shift in clocks incorrect data will be shifted into this shift register based de-multiplexer and could cause hold violations due to best case delays, which leads to wrong data being shifted and system malfunction. The said adaptive adjustment will generate "Shift" pulse such that undesired data is not shifted in the shift register based de-multiplexer and eliminates possible hold violations due to best case delays, irrespective of clock phase shifts. This control signal will be connected to signal 520 of shift register based 1:4 de-multiplexer unit shown in FIG. 2. The timing diagram of shift register based de-multiplexer control unit is shown in FIG. 11, signals "H" to "M" with shift_clock=0. In this figure signal "H" shown is CoreClock with no phase shift, whereas the "Shift" control signal generated with this clock is shown as signal "I". It should be noted that signal "H" is same as "A" and MuxClock used in this control unit is signal "B". The negative (with pos_shift=0 and neg_shift=1) and positive (with pos_shift=1 and neg_shift=0) phase shifted CoreClock is shown as signals "J" and "L", whereas generated "Shift" control signals are shown as signals "K" and "M" with the said clock phase shifts. It should be noted that the control unit will generate exactly identical control signal with either negative/positive phase shift on CoreClock or positive/negative shift on MuxClock respectively.

FIG. 9 and FIG. 10 shows control units for a combinatorial logic gates and register based 4:1 multiplexer and registers based 1:4 de-multiplexer. These control units generates two and four control signals "Sel" for multiplexer and de-multiplexer units respectively, said control signals being adaptively adjusted for not being effected due to the clock signal skew. The said effects due to clock signal skew on control signals include reduced pulse width and/or arrival of one clock cycle earlier than expected and hold violations due to best case delays, which leads to wrong signaling and system malfunction. The said adaptive adjustment will ensure "Sel" signals of one clock cycle width and always at same position and avoid possible hold violations due to best case delays, irrespective of clock phase shifts. The timing diagram of "Sel" control signals are shown in FIG. 11 as signals "N" to "Y" with shift_clock=0. In this figure signals "N" and "T" shown is CoreClock with no phase shift, whereas the "Sel" control signals generated with this clock is shown as signals "O" and "U" for multiplexer and de-multiplexer units respectively. It should be noted that signal "N" and "T" are same as "A" and MuxClock used in these control units is signal "B". The negative (with pos_shift=0 and neg_shift=1) and positive (with pos_shift=1 and neg_shift=0) phase shifted CoreClock is shown as signals "P", "V" and "R", "X", whereas generated "Sel" control signals are shown as signals "Q", "W" and "S", "Y" with the said clock phase shifts. It should be noted that the control unit will generate exactly identical control signals with either negative/positive phase shift on CoreClock or positive/negative shift on MuxClock respectively.

According to one aspect the 4-pin multiplexer or de-multiplexer control units can be extended to support for P signals, where P≧2. The nature of modifications required for various control units are:

Shift register based multiplexer/de-multiplexer control units as shown in FIG. 7 and FIG. 8: For 4:1/1:4 multiplexer/de-multiplexer control units, there are 6 registers (1302, 1303, 1304, 1305, 1306 and 1307 for multiplexer and 1401, 1402, 1403, 1404, 1405 and 1406 for de-multiplexer) clocked by MuxClock signal in series. For multiplexing/de-multiplexing P signals, there should be P+2 registers clocked by MuxClock signal. Additional registers can be added or extra registers can be removed in this 6 register series after 2nd register (1303 incase of multiplexer and 1402 incase of de-multiplexer), such that other functionality is unaffected.

Combinatorial gates and register based multiplexer control unit as shown in FIG. 9: For 4:1 multiplexer control unit, there are 2 registers (1501 and 1502) clocked by MuxClock signal in series in the last stage of "Sel" generation. For multiplexing P signals, there should be P-2 registers clocked by MuxClock along with associated combinatorial gates for generating Sel [(Log$_2$P)-1:0]. It should be noted that if Log$_2$P is not an integer, it should be rounded to next integer value by adding 1 and discarding fraction part.

Registers based de-multiplexer unit as shown in FIG. 10: For 1:4 de-multiplexer control unit, there are 3 registers (1601, 1602 and 1603) clocked by MuxClock signal in series in the last stage of "Sel" generation. For de-multiplexing P signals, there should be P-1 registers clocked by MuxClock signal for generating Sel [P-1:0].

Figure 12:
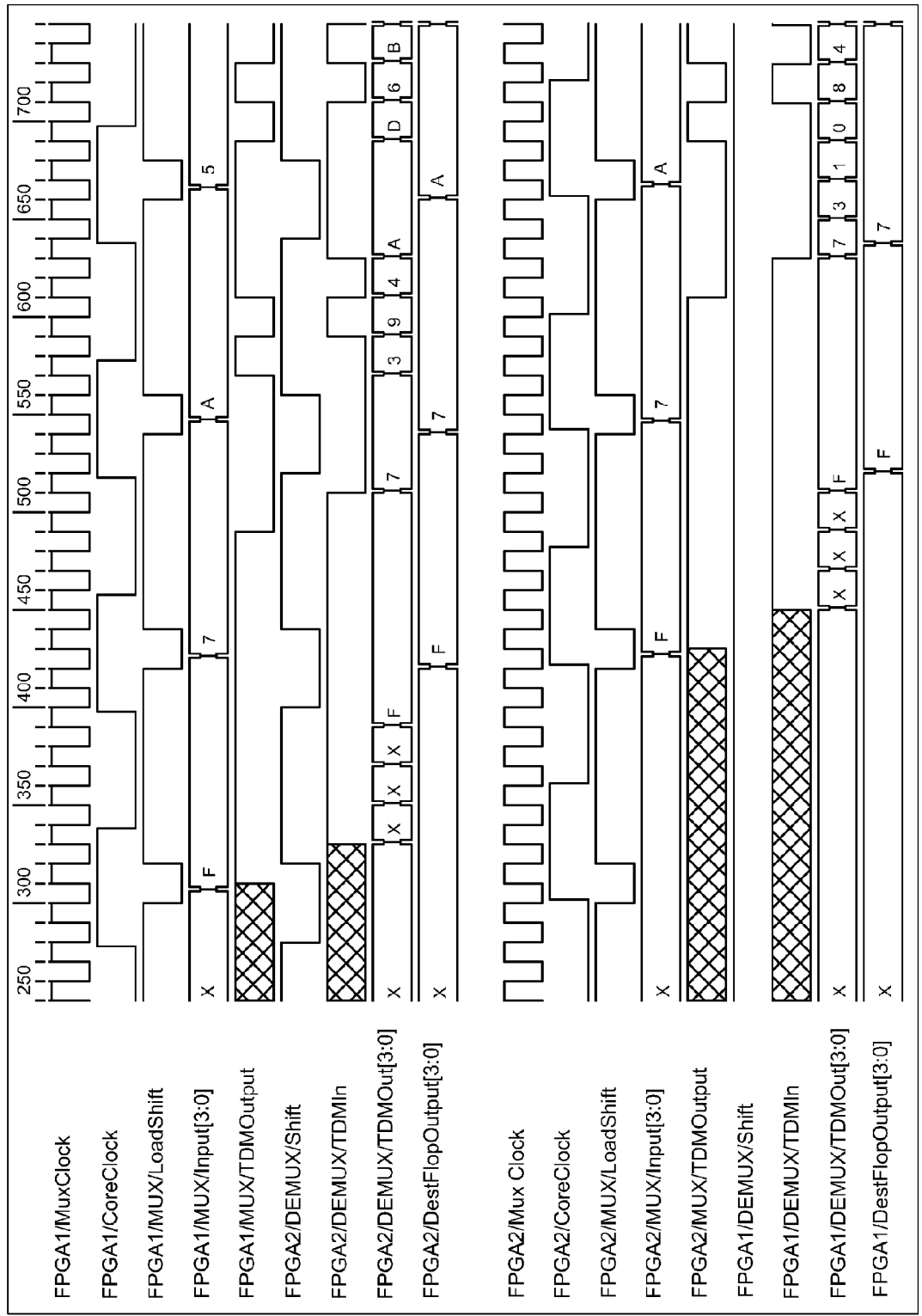
FIGS. 12 to FIG. 15 show example timing diagrams.
Figure 13:
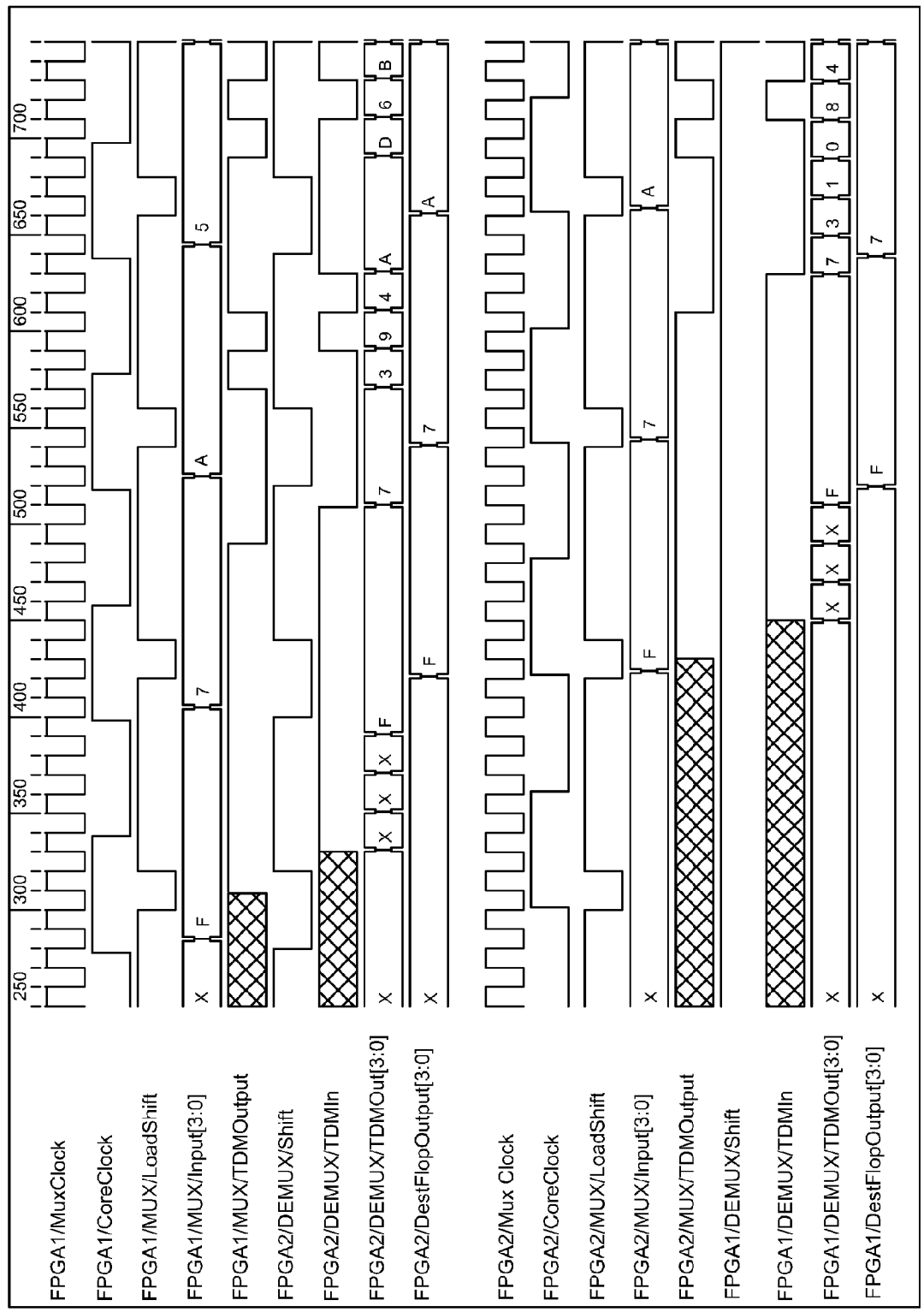
Figure 14:
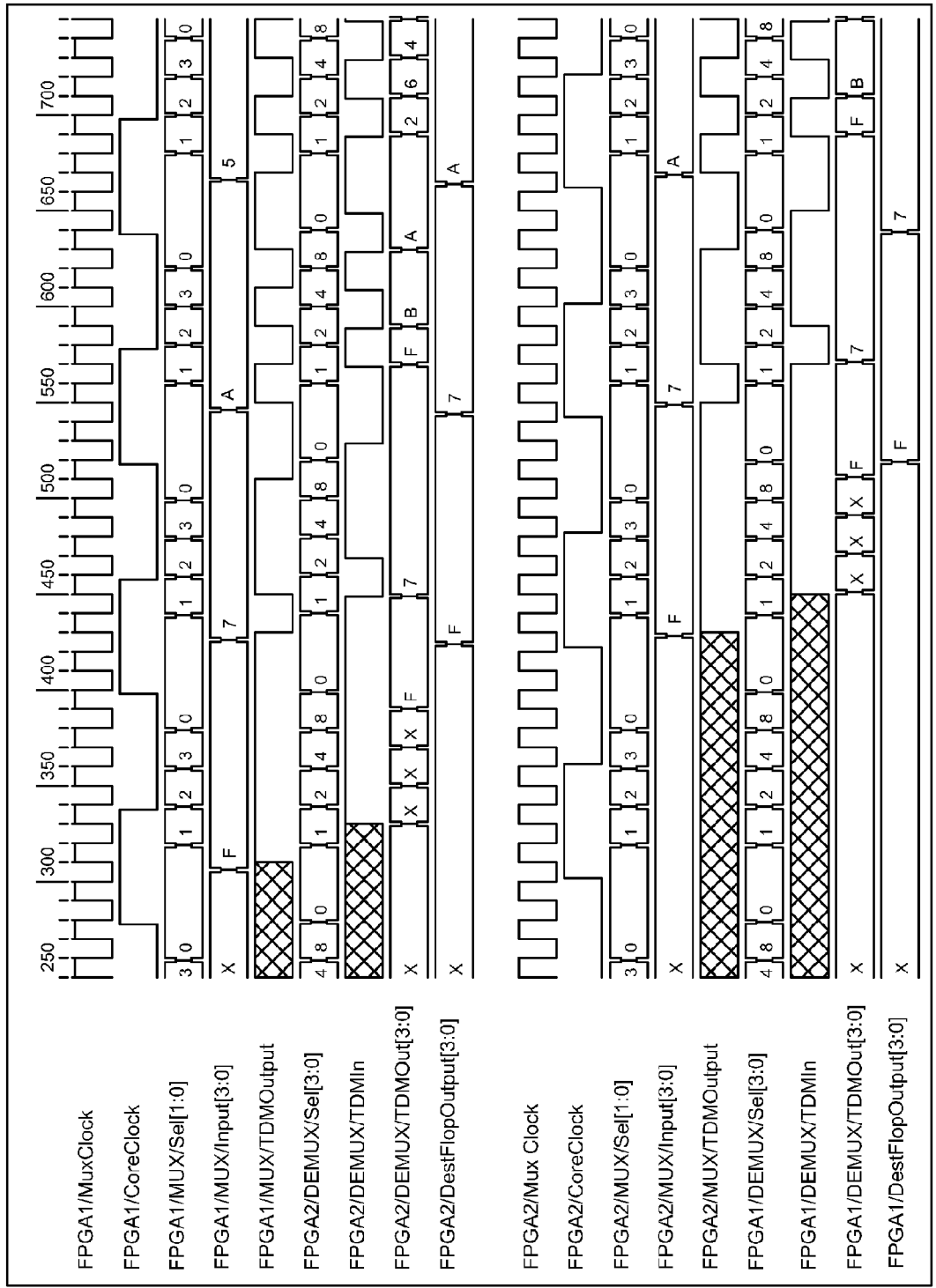
Figure 15:
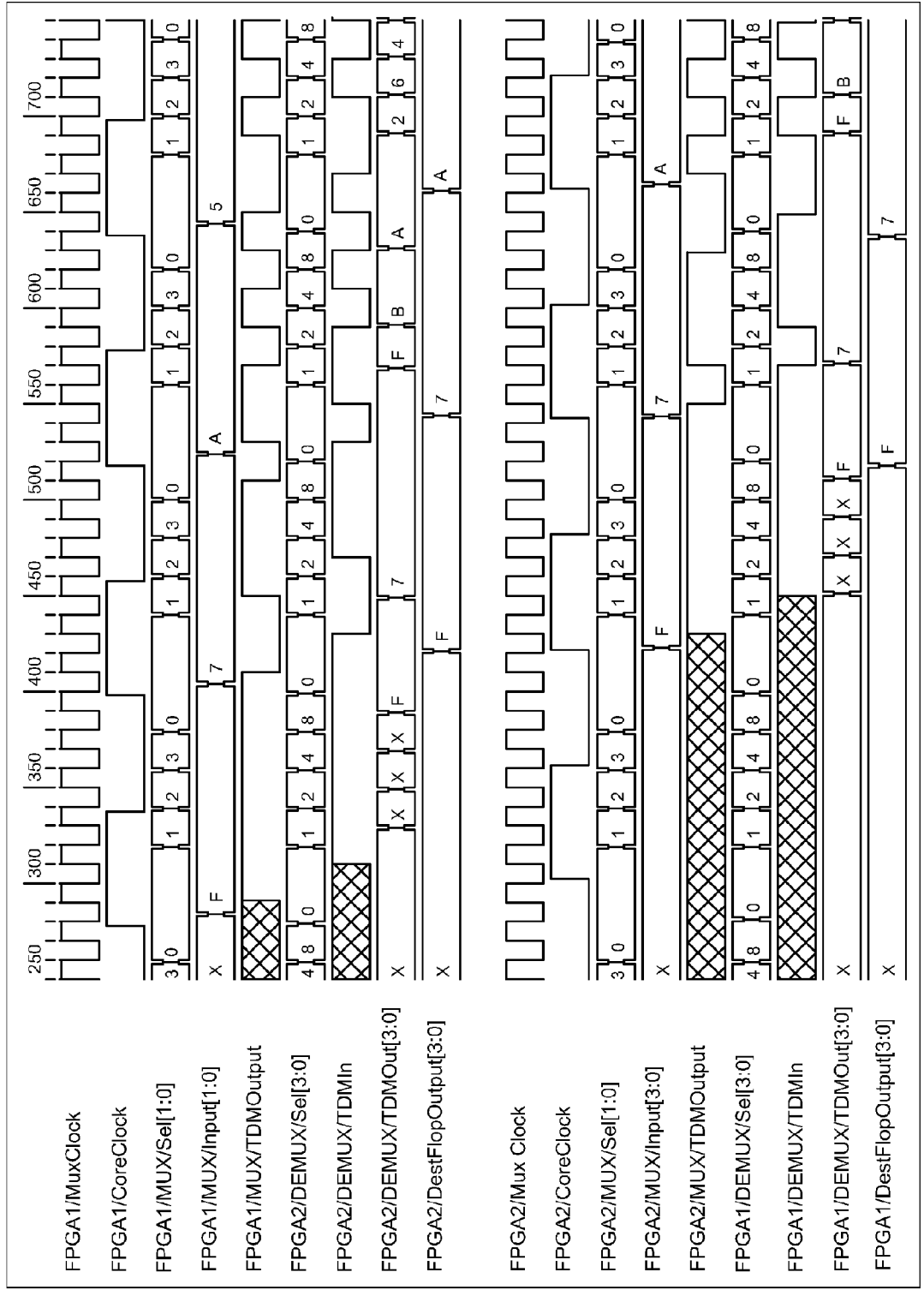

FIG. 12 to FIG. 15 shows example frequency benefits in timing diagrams of shift register and combinatorial gates and/or registers based multiplexer/de-multiplexer units and with worst/best case delays. As shown in these timing diagrams data bytes (F, 7, A and 5) with combinatorial delay have been multiplexed and sent out from FPGA1 (FPGA1/MUX/TDMOutput). This data is de-multiplexed in FPGA2 and sampled with CoreClock signal after combinatorial delay (FPGA2/DestFlopOutput). This sampled data in FPGA2 has again been multiplexed and sent back to FPGA1 (FPGA2/MUX/TDMOutput). This data is de-multiplexed in FPGA1 and sampled with CoreClock signal after combinatorial delay (FPGA1/DestFlopOutput). In all these timing diagrams, data has been sent say on T$^{th}$ edge and could latch back on (T+2)$^{nd}$ edge of CoreClock signal. The other signals shown in these timing diagrams are FPGA1/MuxClock, FPGA1/CoreClock, FPGA1/MUX/LoadShift or Sel, FPGA1/MUX/Input[3:0], FPGA1/DEMUX/Shift or Sel, FPGA1/DEMUX/TDMIn, FPGA1/DEMUX/TDMOut[3:0] which are MuxClock, CoreClock, multiplexer control signal/s, multiplexer input, de-multiplexer control signal/s, de-multiplexer input and de-multiplexer output signals respectively for FPGA1. In these timing diagrams similar set of signals are also shown for FPGA2. In FIG. 13 and FIG. 15, the timing diagrams shown are with best case delays and the clock phase shifts are same as that of with worst case delays. This proves that the system is functioning normal without any hold violations even with best case delays and clock phase shifts.

Following are the various timing parameters used in FIG. 12 timing diagram with PMR=4:

| Timing Parameter | Value (ns) |
|---|---|
| $X_1$ | 20 |
| $Y_A$ | 29 |
| $R_B$ | 6 |
| $X_2$ | 20 |
| $R_A$ | 6 |
| $Y_B$ | 29 |
| $Y_{AB}$ | 19 |
| $R_{AB}$ | 19 |
| m | 3 |

Also a delay of 10 ns is included on "LoadShift" and "Shift" pulses in the timing diagram.

With these timing parameters and conventional method, the maximum prototype/emulation frequency (CoreClock) achievable is 8.62 MHz with MuxClock frequency as 34.48 MHz. As per the algorithm, applied $\delta_1$=−12 ns and $\delta_2$=+12 ns on CoreClock of FPGA1 and FPGA2 respectively. With this phase shift, improved prototype/emulation frequency (CoreClock) is 12.5 MHz with MuxClock signal frequency as 50 MHz.

FIG. 13 is the timing diagram of same system as that of FIG. 12, with best case delays instead of worst case delays and same clock shift as that of shown in FIG. 12. Following are the various timing parameters used in timing diagram with PMR=4:

| Timing Parameter | Value (ns) |
|---|---|
| $X_1$ | 5 |
| $Y_A$ | 8 |
| $R_B$ | 2 |
| $X_2$ | 5 |
| $R_A$ | 2 |
| $Y_B$ | 8 |
| $Y_{AB}$ | 19 |
| $R_{AB}$ | 19 |
| m | 3 |

Also a delay of 10 ns is included on "LoadShift" and "Shift" control signals in the timing diagram.

As per the algorithm and based on worst case delays, applied $\delta_1$=−12 ns and $\delta_2$=+12 ns on CoreClock signal of FPGA1 and FPGA2 respectively. This timing diagram shows that system is functioning normally with best case delays even with clock phase shifts. Here $Y_{AB}$ and $R_{AB}$ are shown as 19 ns even in this best case delay scenario. The reason for this is, these parameters are dominated by board trace delays and could still be high. Similarly delay on said control signal/s has also been kept same as that of in worst case delays. However system will still function normally even when the above said timing and delay parameters are lower in best case. Also it should be noted that the system will function normally even with mix of best and worst case delays.

The timing diagrams shown in FIG. 14 and FIG. 15 are with same timing parameters as that of FIG. 12 and FIG. 13 applied with combinatorial gates and/or registers based multiplexer/de-multiplexer unit instead of shift register based.

Figure 16:
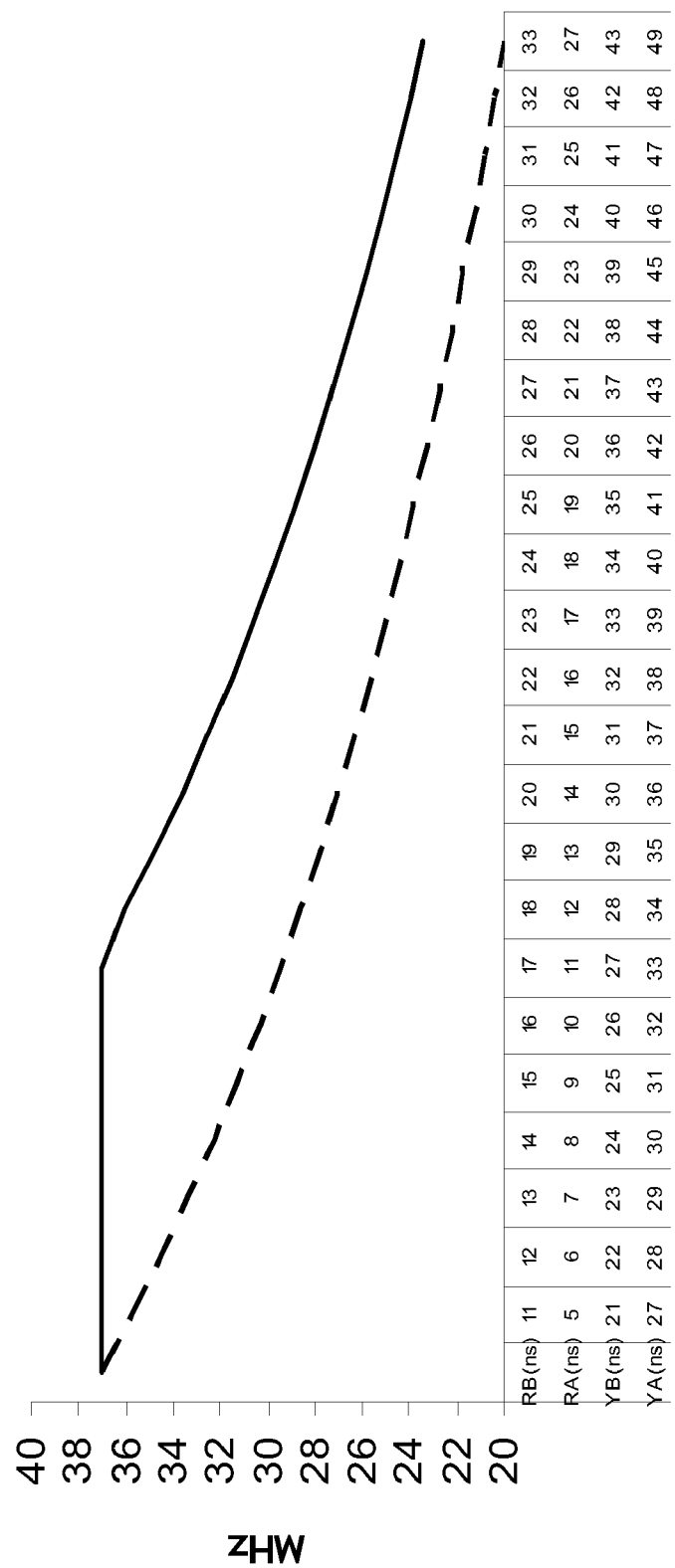
FIG. 16 shows an example graph depicting example improvement in operating frequency.

An example of prototype/emulation system frequency improvement with invented method is shown in FIG. 16. The frequency improvement shown in this figure is for illustration purpose and not representing the maximum benefits achievable with this invention. The maximum frequency benefits achievable can go beyond 90%. For example with $Y_A$=51 ns, $Y_B$=51 ns, $R_A$=1 ns, $R_B$=1 ns, $Y_{AB}$=26 ns, $R_{AB}$=26 ns, $X_1$=26 ns, $X_2$=24 ns, m=0.5 ns and PMR=4, conventional prototype/emulation frequency (CoreClock) achievable is 3.3 MHz. Where as with the invented technique achievable overall prototype/emulation frequency (CoreClock) is 6.3 MHz, which is 92.5% improvement over conventional.

The invention discussed herein can be applied to any type of multi-FPGA (multi-programmable devices) topologies including but not limited to 4-Way mesh, 8-Way mesh and Crossbar. From connectivity point of view, worst case topology is where every FPGA is connected to every other FPGA in a prototype/emulation system. Various paths shown in Table 1 need to be extended for multi-FPGA environment as shown in Table 4, where F is number of FPGAs connected to FPGA1. With the determined timing parameter values, the phase shift required in FPGA1 ($\delta_1$) can be found using the algorithm discussed earlier.

Improved FPGA1 frequency=$[1/((MAX (Y_A, R_B) - |\delta_1|+m)*N)]$MHz

This process needs to be repeated for every FPGA in prototype/emulation system, to determine phase shift needs in every FPGA. The polarity of the shift and whether to apply phase shift on CoreClock or MuxClock can be determined as per Table 2.

Minimum value of various FPGA individual improved frequencies will be the overall improved prototype/emulation frequency.

TABLE 4

| FPGA Number | Worst case Register/IO to IO/Register paths | | Parameter |
|---|---|---|---|
| | From Clock domain | To Clock domain | |
| 1 | CoreClock | CoreClock | $X_1$ |
| 1 | CoreClock | MuxClock | $Y_A$ |
| 1 | MuxClock | CoreClock | $R_B$ |
| 2, 3, 4, 5, 6 ... F | CoreClock | CoreClock | $X_2$ |
| 1 to 2, 3, 4, 5, 6 ... F | FPGA1 MuxClock driven Register to IO delay + Interconnect Board trace delay + IO to MAX(FPGA2, 3, 4, 5, 6 ... F MuxClock driven Register delay) | | $Y_{AB}$ |
| 2, 3, 4, 5, 6 ... F to 1 | MAX(FPGA2, 3, 4, 5, 6 ... F MuxClock driven Register to IO delay) + Interconnect Board trace delay + IO to FPGA1 MuxClock driven Register delay | | $R_{AB}$ |

Also as explained earlier, registers need to be introduced on source and destination FPGAs which has non-multiplexed inter-FPGA connections.

Figure 17:
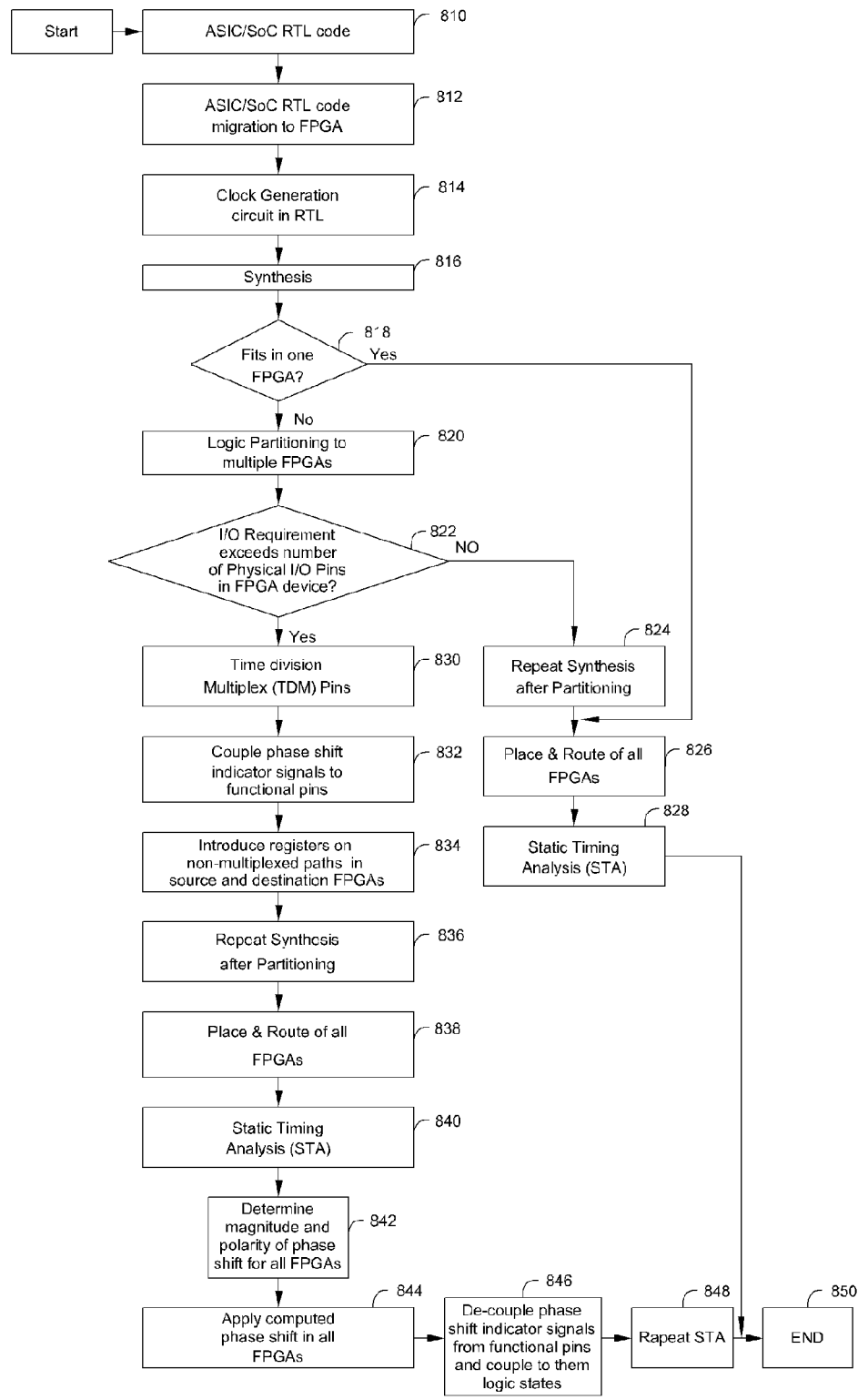
FIG. 17 shows a flow diagram.
Figure 18:
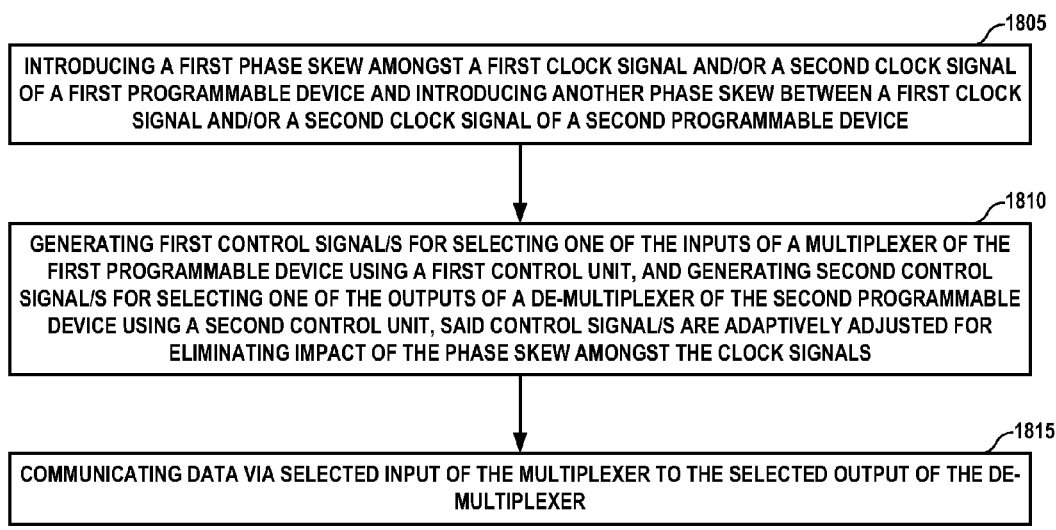
FIG. 18 illustrates a flow chart of a method for communicating data from a first programmable device to a second programmable device, according to one embodiment.

FIG. 17 shows a flow diagram of the method for implementing a system, which is capable of supporting data communication using skewed clock signals amongst programmable devices according to the invention. In step 810 a register transfer logic (RTL) of ASIC/SoC is input to FPGA prototype/emulation. In step 812 the said RTL is converted for implementing it on a programmable device. In step 814 a clock generation circuit is coded using register transfer logic. In steps 816 and 818 logic is synthesized and a condition is checked if the logic is implementable on a single programmable device. If the condition is true then steps 826, 828 and 850 are followed, in which these the logic is placed and routed on the programmable device and a static timing analysis is carried out. Whereas if the condition not being true then the logic is partitioned in step 820 and it is checked if input/output pin requirement of the logic is more than physically present input/output pins on the programmable devices that are being used for placing and routing the logic. If the condition is not true then in step 824 after partitioning synthesis is carried out and steps 826, 828 and 850 are followed. If the condition being true then in step 830 the pins of programmable device are multiplexed for allowing time division multiplexing between the inputs/outputs of logic. The multiplexer, de-multiplexer control units are used in step 830. In next step 832 the phase shift indicators of each programmable device are coupled to a plurality of functional pins of respective programmable device. In next step 834 delay elements (normally registers) are supplied preceding to the input/output pins of the programmable devices that are not multiplexed. In step 836 a synthesis is carried out after partitioning the logic for implementing said logic in a plurality of programmable devices. In step 838 logic is placed and routed on programmable logic devices. In step 840 a plurality of timing parameters are determined, said timing parameters being indicative of time required for data communication amongst elements of each programmable device and/or time required for communicating data from an output pin of a programmable device to an input pin of other programmable device or any combination thereof. In step 842 a phase shift-value, polarity and whether to apply on first or second clock signal is determined for each programmable device. In step 844 the first or second clock signals of each programmable device are shifted by an amount and polarity determined by the phase shift-value on either first or second clock signal for respective programmable device, and in step 846 the control unit inputs that were coupled to the functional pins are decoupled and coupled to a plurality of logic states, said plurality of logic states together being indicative of a phase skew relation between the first clock signal and the second clock signal of respective programmable devices. In step 848 and 850 repeating timing analysis and concluding the process.

Further the invention can be automated in synthesis, place and route EDA (Electronic Design Automation) tool flow with a single pass and there is no need to iterate between synthesis and place and route. Following is the summary of various steps in the present invention and role of standard EDA tools automation.

Multiplexer/De-multiplexer programmable control units (Steps 830 and 832): Synthesis EDA tools can automate this process of programmable multiplexer/de-multiplexer unit along with control unit insertion. Also the control signals of the programmable control units can be automatically coupled to other functional pins of FPGA. This pin mapping information can be passed on to place and route tools in the constraint file.

Registers on non-multiplexed inter-FPGA paths (Step 834): This process can also be automated in Synthesis EDA tool.

Determining magnitude and polarity of phase shift (Step 842): This should be done with STA reports of post place and routed data base, board trace delays and algorithm as discussed earlier. The place and route tools can automate this process.

Applying phase shift in FPGA (Step 844): The phase shift magnitude and polarity can be configured in appropriate PLLs of clock generation logic on place and routed database. The place and route tools can automate this process.

Programming control unit of multiplexer/de-multiplexer (Step 846): After determining magnitude and polarity of the phase shift, control unit indicator connections to functional pins done during synthesis needs to be decoupled and coupled to logic states as discussed earlier. The place and route tools can automate this process.

Although the flowchart in FIG. 17 includes various steps that are arranged serially in the exemplary embodiments, other embodiments of the subject matter may execute two or more steps in parallel, using multiple processors or a single processor organized as two or more virtual machines or sub-processors.

The above description is intended to be illustrative, and not restrictive. Many other embodiments will be apparent to those skilled in the art. The scope of the subject matter should therefore be determined by the appended claims, along with the full scope of equivalents to which such claims are entitled.

As shown herein, the present subject matter can be implemented in a number of different embodiments, including various methods, a circuit, an I/O device, a system, and an article comprising a machine-accessible medium having associated instructions.

Other embodiments will be readily apparent to those of ordinary skill in the art. The elements, algorithms, and sequence of operations can all be varied to suit particular requirements. The operations described-above with respect to the method can be performed in a different order from those shown and described herein.

Figures herewith are merely representational and are not drawn to scale. Certain proportions thereof may be exaggerated, while others may be minimized. All the figures illustrate various embodiments of the subject matter that can be understood and appropriately carried out by those of ordinary skill in the art.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive invention lies in less than all features of a single disclosed embodiment. Thus the following claims are hereby incorporated into the detailed description of the embodiments of the invention, with each claim standing on its own as a separate preferred embodiment.

The invention claimed is:

1. A programmable logic device comprising:
   a plurality of logic elements and a plurality of I/O pins;
   at least one of a multiplexer unit and a de-multiplexer unit coupled between said plurality of logic elements and plurality of I/O pins, wherein a phase shift-value along with polarity to apply on a first clock signal or a second clock is determined, and wherein said first clock signal or second clock signal is shifted with the determined phase shift-value; and
   a control unit for generating control signals for selecting at least one input of the multiplexer unit and at least one output of the de-multiplexer unit, said control unit includes inputs for receiving said first clock signal, said second clock signal, and indicators, said indicators being indicative of a phase skew amongst the first clock signal and the second clock signal and the control unit being configured for generating adaptively adjusted control signals according to the first clock signal and the second clock signal and indicators, said adaptively adjusted control signals are adaptively adjusted for eliminating impact of the phase skew amongst the first clock signal and the second clock signal, wherein the adaptively adjusted control signals are used to select at least one input of the multiplexer unit and at least one output of the de-multiplexer unit, and wherein the indicators are decoupled from functional pins and coupled to a plurality of logic states, said plurality of logic states together being indicative of a phase skew amongst the first clock signal and the second clock signal.

2. The device as claimed in claim 1, further comprising:
   a logic element coupled directly to the plurality of I/O pins through one or more delay elements.

3. The device as claimed in claim 1, wherein said control unit comprises:
   a series of registers, wherein each register of said series of registers providing an output; and
   a logic unit receiving said indicators for selectively providing one of the outputs of the registers of said series of registers as the adaptively adjusted control signals.

4. The device as claimed in claim 3, wherein a first register of said series of registers is provided with the first clock signal and remaining registers are provided with the second clock signal.

5. The device as claimed in claim 3, wherein the output of a second register of said series of registers is coupled to clear or reset input of a first register of said series of registers.

6. The device as claimed in claim 3, wherein said logic unit comprises a plurality of logic gates for selectively providing one of the output of a first register and a second register as the adaptively adjusted control signals.

7. The device as claimed in claim 1, further comprises a clock signal generating circuit.

8. The device as claimed in claim 1, said first and second clock signals are time varying signals, wherein the second clock signal varies at a speed that is at least P times higher than the speed of the first clock signal, and wherein P is a number of input or output signals that are multiplexed or de-multiplexed-by at least one of the multiplexer unit and the de-multiplexer unit.

9. The device as claimed in claim 1, wherein said second clock signal is a MuxClock signal supplied for clocking said at least one of the multiplexer unit and the de-multiplexer unit and associated control unit.

10. The device claim as claimed in claim 1, wherein said first clock signal is a CoreClock signal supplied for clocking said programmable logic device.

11. The device as claimed in claim 1, wherein said adaptively adjusted control signals are adaptively adjusted according to said indicators for eliminating false signaling or glitches and hold violations due to best case delays, caused due to skewed clock signals.

12. A control unit comprising:
   a plurality of inputs for receiving a first clock signal, a second clock signal, and indicators, wherein said indicators being indicative of a phase skew amongst the first clock signal and the second clock signal and the control unit being configured for generating adaptively adjusted control signals according to the first clock signal and the second clock signal and indicators, said adaptively adjusted control signals are adaptively adjusted for eliminating impact of the phase skew amongst the first clock signal and the second clock signal, wherein the adaptively adjusted control signals are used to select at least one input of a multiplexer unit and at least one output of a de-multiplexer unit, and wherein said first clock signal or second clock signal is shifted with a determined phase shift-value, said phase shift-value being determined along with polarity to apply on the first clock signal or the second clock, and wherein the indicators are decoupled from functional pins and coupled to a plurality of logic states, said plurality of logic states together being indicative of the phase skew amongst the first clock signal and the second clock signal.

13. The control unit as claimed in claim 12, further comprises a series of registers, wherein each register of the series of registers provides an output, and a logic unit receiving said indicators for selectively providing one of the output of a first register and a second register as the adaptively adjusted control signals.

14. The control unit as claimed in claim 13, wherein the first register of said series of registers is provided with the first clock signal and remaining registers are provided with the second clock signal.

15. The control unit as claimed in claim 13, wherein the output of the second register of said series of registers is coupled to clear or reset input of the first register.

16. The control unit as claimed in claim 13, wherein said logic unit comprises a plurality of logic gates for selectively providing one of the output of the first register and the second register as the adaptively adjusted control signals.

17. The control unit as claimed in claim 12, wherein said adaptively adjusted control signals are adaptively adjusted according to said indicators for eliminating false signaling or glitches and hold violations due to best case delays, caused due to skewed clock signals.

18. A coupling device, wherein the coupling device being capable of selectively coupling a first line to a second line of which at least the first or the second line is one amongst a plurality of lines, the coupling device comprising:
 a control unit for enabling selection of the plurality of lines, wherein said control unit includes a plurality of inputs for receiving a first clock signal, a second clock signal, and indicators, wherein said indicators being indicative of a phase skew amongst the first clock signal and the second clock signal and the control unit being configured for generating adaptively adjusted control signals according to the first clock signal and the second clock signal and indicators, said adaptively adjusted control signals are adaptively adjusted for eliminating impact of the phase skew amongst the first clock signal and the second clock signal, wherein the adaptively adjusted control signals are used to select at least one of the plurality of lines, and wherein said first clock signal or second clock signal is shifted with a determined phase shift-value, said phase shift-value being determined along with polarity to apply on the first clock signal or the second clock, and wherein the indicators are decoupled from functional pins and coupled to a plurality of logic states, said plurality of logic states together being indicative of the phase skew amongst the first clock signal and the second clock signal.

19. The coupling device as claimed in claim 18, wherein said control unit includes a series of registers, each register of the series of registers provides an output, and wherein the coupling device includes a logic unit for receiving said indicators to selectively provide one of the outputs of the series of registers as the adaptively adjusted control signals.

20. The coupling device as claimed in claim 19, wherein a first register of said series of registers is provided with the first clock signal and remaining registers are provided with the second clock signal.

21. The coupling device as claimed in claim 19, wherein the output of a second register of said series of registers is coupled to a clear or reset input of a first register.

22. The coupling device as claimed in claim 19, wherein said logic unit comprises a plurality of logic gates for selec-
tively providing one of the output of a first register and a second register of said series of registers as the adaptively adjusted control signals.

23. The coupling device as claimed in claim 18, wherein said adaptively adjusted control signals are adaptively adjusted according to said indicators for eliminating false signaling or glitches and hold violations due to best case delays, caused due to skewed clock signals.

24. A method for generating a control signal comprising the steps of:
 providing a series of registers, wherein each register of the series of registers providing an output;
 supplying a first clock signal to a first register of the series of registers and a second clock signal to remaining registers of the series of registers, wherein said first clock signal or second clock signal is shifted with a determined phase shift-value, said phase shift-value being determined along with polarity to apply on the first clock signal or the second clock;
 supplying a plurality of indicators indicative of a phase skew amongst said first clock signal and second clock signal, wherein the indicators are decoupled from functional pins and coupled to a plurality of logic states, said plurality of logic states together being indicative of the phase skew amongst the first clock signal and the second clock signal; and
 supplying selectively one of the outputs of the series of registers as a control signal, said control signal is adaptively adjusted according to the plurality of indicators for eliminating impact of the phase skew amongst the first and second clock signals, wherein the adaptively adjusted control signal is used to select at least one input of a multiplexer unit and at least one output of a de-multiplexer unit.

25. A method for communicating data from a first programmable device and to a second programmable device, said method comprising the steps of:
 introducing a first phase skew amongst at least one of a first clock signal and a second clock signal of the first programmable device, wherein a first phase shift-value along with polarity to apply on the first clock signal or the second clock is determined, and the first clock signal or the second clock signal is shifted with the determined first phase shift-value, and introducing a second phase skew amongst at least one of the first clock signal and the second clock signal of the second programmable device, wherein a second phase shift-value along with polarity to apply on the first clock signal or the second clock is determined, and the first clock signal or the second clock signal is shifted with the determined second phase shift-value;
 generating first control signals for selecting at least one input of a multiplexer of the first programmable device using a first control unit, said first control unit receiving the first clock signal and the second clock signal of the first programmable device and a first plurality of indicators, said first plurality of indicators being indicative of the first phase skew amongst the first clock signal and the second clock signal of the first programmable device, wherein the first plurality of indicators are decoupled from functional pins and coupled to a first plurality of logic states, said first plurality of logic states together being indicative of the first phase skew amongst the first clock signal and the second clock signal, and generating second control signals for selecting at least one output of a de-multiplexer of the second programmable device using a second control unit, said second control unit receiving the first clock signal and the second clock signal of the second programmable device and a second plurality of indicators, said second plurality of indicators being indicative of the second phase skew amongst the first clock signal and the second clock signal of the second programmable device, wherein the second plurality of indicators are decoupled from functional pins and coupled to a second plurality of logic states, said second plurality of logic states together being indicative of the second phase skew amongst the first clock signal and the second clock signal, said first and second control signals are adaptively adjusted for eliminating impact of the first and second phase skew amongst the first clock signal and the second clock signal for both the first programmable device and the second programmable device, wherein the adaptively adjusted first and second control signals are used to select at least one input of the multiplexer unit and at least one output of the de-multiplexer unit; and communicating data via a selected input of the multiplexer to a selected output of the de-multiplexer for both the first programmable device and the second programmable device.

26. The method as claimed in claim 25, wherein said step of introducing comprises:

determining a plurality of timing parameters, said plurality of timing parameters being indicative of time required for data communication amongst elements of each programmable device and time required for communicating data from an output pin of the first programmable device to an input pin of the second programmable device or any combination thereof, and;

determining a first shift-value and a second shift-value along with polarity to apply on either first clock signal or second clock signal, using said plurality of timing parameters.

27. The method as claimed in claim 26, wherein said step of introducing further comprises:

introducing the first phase skew by an amount and polarity of the determined first shift-value on either first clock signal or second clock signal of the first programmable device and includes step of introducing the second phase skew by an amount and polarity of the determined second shift-value on either first clock signal or second clock signal, of the second programmable device.

28. The method as claimed in claim 26 wherein step of determining the plurality of timing parameters includes steps of coupling the first plurality of indicators of the first control unit and the second plurality of indicators of the second control unit to a plurality of functional pins of the first programmable device and the second programmable device.

29. The method as claimed in claim 25 wherein the step of introducing the first phase skew and the second phase skew includes decoupling the first plurality of indicators of the first control unit and the second plurality of indicators of the second control unit from functional pins and coupling them to logic states that are indicative of phase skew amongst the first clock signal and the second clock signal for both the first programmable device and the second programmable device.

30. The method as claimed in claim 25 wherein the method further comprising steps of communicating data directly amongst the first programmable device and the second programmable device directly via one or more delay elements.

31. A non-transitory computer readable storage medium for storing a set on instructions that, when executed by a machine, cause the machine to perform a method to carry out the steps of claim 25.

32. A method for implementing a system, said system being capable of supporting data communication using skewed clock signals amongst a plurality of programmable devices according to claim 1, said method comprising steps of:

synthesizing logic and checking condition if said logic is implementable on a first programmable device of the plurality of programmable devices and performing following steps if said condition not being true;

checking condition if input and output pins requirement of the logic is more than physically present input and output pins on the plurality of programmable devices and performing following steps if said condition being true;

multiplexing logic inputs and outputs using control units for allowing time division multiplexing between the inputs and outputs of logic;

coupling indicators to a plurality of functional pins of the control units of the plurality of programmable devices;

supplying delay elements preceding to the input and output pins of the plurality of programmable devices that are not multiplexed;

partitioning logic, synthesis, place and route for implementing said logic in the plurality of programmable devices;

determining a plurality of timing parameters, said plurality of timing parameters being indicative of time required for data communication amongst elements of each of the plurality of programmable devices and time required for communicating data amongst the output pins and the input pins of the plurality of programmable devices or any combination thereof;

determining a phase shift-value along with polarity to apply on a first clock signal or a second clock signal, for each of the plurality of programmable devices;

shifting said first clock signal or second clock signal of each of the plurality of programmable devices with determined phase shift-value for each of the plurality of programmable devices, and;

decoupling indicators from the functional pins and coupling them to a plurality of logic states, said plurality of logic states together being indicative of a phase skew amongst the first clock signal and the second clock signal of each of the plurality of programmable devices.

* * * * *